United States Patent
Zhang et al.

(10) Patent No.: US 11,271,585 B2
(45) Date of Patent: Mar. 8, 2022

(54) SIGMA DELTA MODULATOR, INTEGRATED CIRCUIT AND METHOD THEREFOR

(71) Applicant: NXP B.V., San Jose, CA (US)

(72) Inventors: Chenming Zhang, Eindhoven (NL); Lucien Johannes Breems, Waalre (NL); Muhammed Bolatkale, Delft (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/065,731

(22) Filed: Oct. 8, 2020

(65) Prior Publication Data
US 2021/0126648 A1      Apr. 29, 2021

(30) Foreign Application Priority Data

Oct. 28, 2019 (EP) .................................. 19205542

(51) Int. Cl.
*H03M 3/00* (2006.01)
(52) U.S. Cl.
CPC .............. *H03M 3/47* (2013.01); *H03M 3/356* (2013.01); *H03M 3/38* (2013.01); *H03M 3/43* (2013.01); *H03M 3/452* (2013.01)
(58) Field of Classification Search
CPC .......... H03M 3/47; H03M 3/356; H03M 3/38; H03M 3/43; H03M 3/452; H03M 3/424;
(Continued)

(56) References Cited

U.S. PATENT DOCUMENTS

| 5,257,026 A * | 10/1993 | Thompson | H03M 3/388 341/118 |
| 6,271,781 B1 * | 8/2001 | Pelion | H03M 3/388 341/143 |

(Continued)

OTHER PUBLICATIONS

Bolatkale, M., "A 4 GHz continuous-time ΔΣ ADC with 70 dB DR and −74 dBFS THD in 125 MHz BW", IEEE Journal of Solid-State Circuits, vol. 46, No. 12, Dec. 2011.

(Continued)

*Primary Examiner* — Lam T Mai

(57) ABSTRACT

A N-bit continuous-time sigma-delta modulator, SDM, (800) includes an input configured to receive an input analog signal (302); a first summing junction (304) configured to subtract a feedback analog signal (303) from the input analog signal (302); a loop filter (306) configured to filter an output signal from the first summing junction (304): an N-bit analog-to-digital converter, ADC, comprising at least one 1-bit ADC configured to convert the filtered analog output signal (309) to a digital output signal (314) where each 1-bit ADC comprises at least one pair of comparator latches (336, 356); and a feedback path (316) for routing the digital output signal to the first summing junction (304). The feedback path (316) includes a plurality of digital-to-analog converters, DACs, configured to convert the digital output signal (314) to an analog form. The ADC comprises or is operably coupled to, a calibration circuit (650, 840) coupled to an input and an output of the at least one pair of comparator latches (336, 356) and configured to apply respective calibration signals to individual comparator latches of the at least one pair of comparator latches (336, 356) in a time-Interleaved manner, and calibrate a comparator error of the comparator latches in response to a latched output of the respective calibration signals.

20 Claims, 11 Drawing Sheets

(58) Field of Classification Search
CPC .... H03M 3/02; H03M 1/1004; H03M 1/1061; H03M 1/66
See application file for complete search history.

(56) References Cited

U.S. PATENT DOCUMENTS

| | | | |
|---|---|---|---|
| 9,065,464 B2* | 6/2015 | Zhang | H03M 1/0624 |
| 9,621,183 B2* | 4/2017 | Baringer | H03M 3/358 |
| 10,439,634 B2* | 10/2019 | Bolatkale | H03M 3/464 |
| 2019/0245553 A1 | 8/2019 | Bolatkale et al. | |
| 2020/0067521 A1* | 2/2020 | Herve | H03M 3/388 |
| 2020/0373938 A1* | 11/2020 | Quiquempoix | H03M 1/1245 |
| 2020/0373939 A1* | 11/2020 | Quiquempoix | H03M 3/466 |

OTHER PUBLICATIONS

Cherry, J.A., "Excess Loop Delay in Continuous-Time Delta-Sigma Modulators", IEEE Transactions on Circuits and Systems—II: Analog and Digital Signal Processing, vol. 46, No. 4, Apr. 1999.

Dong, Y., "A continuous-time 0-3 MASH ADC achieving 88 dB DR With 53 MHz BW in 28 nm CMOS", IEEE Journal of Solid-State Circuits, vol. 49, No. 12, Dec. 2014.

Dyer, K., "Analog Background Calibration of a 10 b 40 MSample/s Parallel Pipelined ADC", ISSCC98 / Session 9 / ADCs /Paper FA 9.3, Jun. 2015.

\* cited by examiner

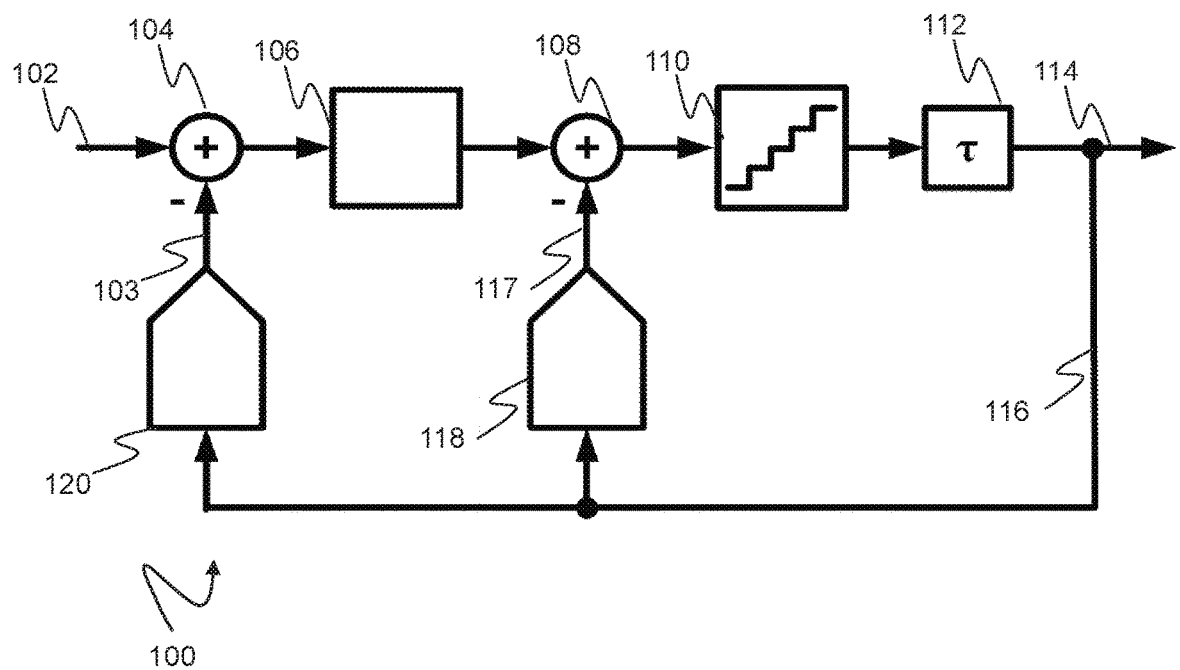
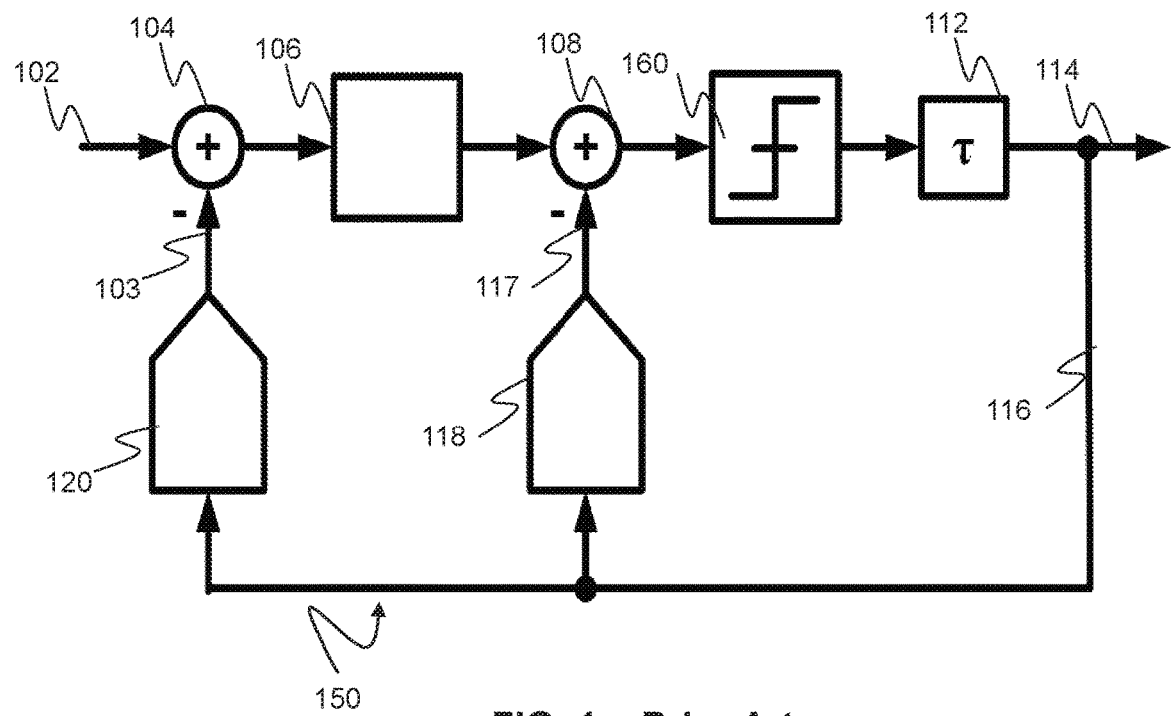
FIG. 1 – Prior Art

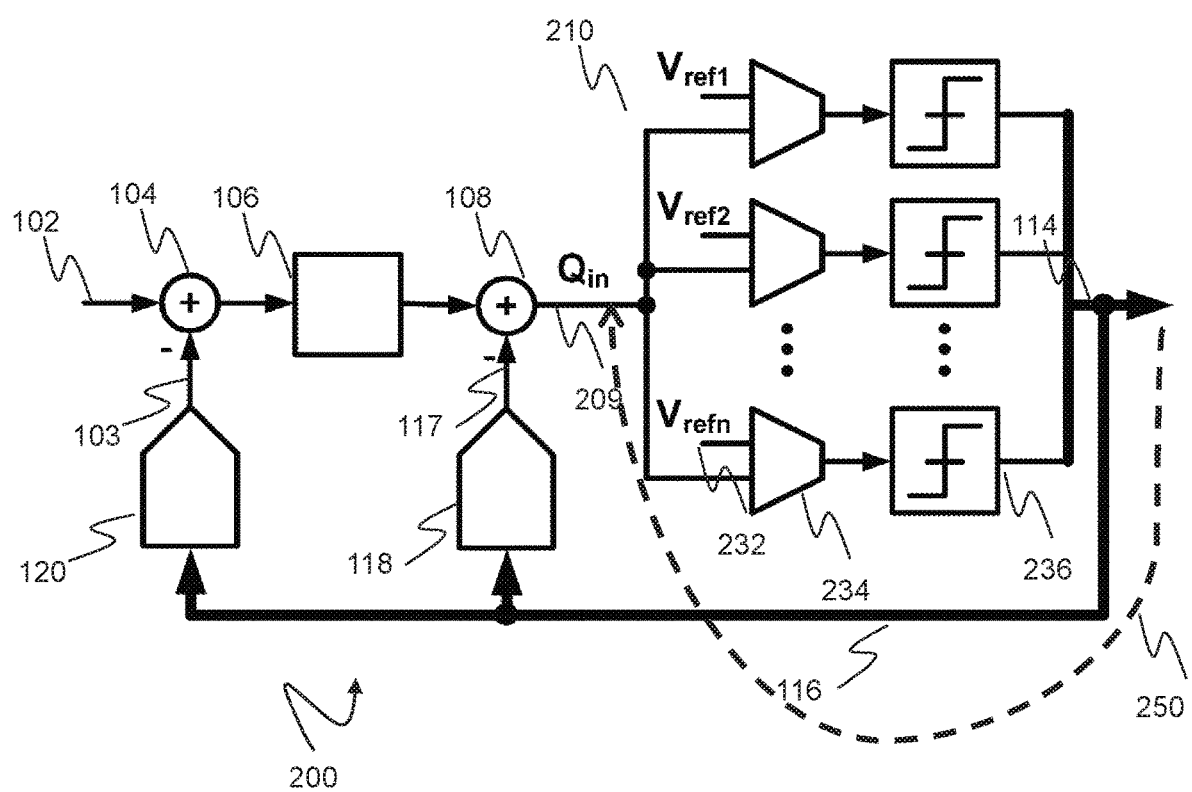
FIG. 2 – Prior Art

SIGMA DELTA MODULATOR, INTEGRATED CIRCUIT AND METHOD THEREFOR

CROSS-REFERENCE TO RELATED APPLICATIONS

This application claims the priority under 35 U.S.C. § 119 of European Patent application no. 19205542.4, filed on 28 Oct. 2019, the contents of which are incorporated by reference herein.

FIELD OF THE INVENTION

The field of this invention relates to a sigma-delta modulator, an integrated circuit and method therefor. In particular, the field relates to loop delay compensation for continuous-time sigma-delta ADCs with N-bit quantization.

BACKGROUND OF THE INVENTION

Analog-to-digital converters (ADCs) with signal bandwidth (BW)>500 MHz and Signal to Noise and Distortion Ratio (SNDR)>60 dB are needed for many applications, such as: base station receivers, automotive ethernet, and next generation 5G cellular telecommunications. Sigma-Delta modulation is a method for encoding analog signals into digital signals, often used in an analog-to-digital converter (ADC) and capable of achieving these performance levels. Sigma-Delta modulation is also used to transfer high bit-count, low frequency, digital signals into lower bit-count, higher frequency, digital signals as part of the process to convert digital signals into analog (i.e. as part of a digital-to-analog converter (DAC)). Sigma-delta ADCs are over-sampling ADCs that sample the signal at much higher rates than a Nyquist rate.

In a conventional ADC, an analog signal is integrated, or sampled, with a sampling frequency and subsequently quantized in a multi-level quantizer into a digital signal. This process introduces quantization error noise. The first step in a sigma-delta modulation is delta modulation. In delta modulation the change in the signal (i.e. its 'delta') is encoded, rather than the absolute value. The result is a stream of pulses, as opposed to a stream of numbers, as is the case with pulse code modulation. In sigma-delta modulation, the accuracy of the modulation is improved by passing the digital output through a 1-bit DAC and adding (sigma) the resulting analog signal, to the input signal (the signal before delta modulation), thereby reducing the error introduced by the delta-modulation.

Discrete-time ADCs implemented using switched-capacitor circuits have been the designer's choice for the last few decades. However, recently, continuous-time sigma-delta ADCs have gained popularity in technical journals and the industry. Continuous-time sigma-delta ADCs with multi-bit quantization are popular for bandwidths (BW) larger than 100 MHz. Multi-bit quantization has the advantages of lower quantization noise, relaxed clock jitter requirement, and it allows the designers to use more aggressive noise transfer functions (NTFs). The principle of noise shaping and oversampling in continuous-time sigma-delta ADCs remains the same as its discrete-time counterpart. The key difference between a continuous-time sigma-delta ADC and a discrete time sigma-delta ADC is where the sampling operation takes place. In the continuous-time design, input sampling takes place just before the quantizer. The loop filter is now continuous-time using continuous-time integrators, often resistor-capacitor (RC) or transconductance-capacitor (gm/C) integrators.

Continuous-time sigma-delta ADCs contain one or multiple sigma-delta modulators (SDMs). A SDM is a feedback loop containing a loop filter, the quantizer, and the feedback DAC(s). The function of the quantizer is sampling and quantization. Its input signal is continuous in time domain and continuous in voltage (or current) domain, i.e. a continuous-time, continuous-value (analog signal).

Its output signal should be discrete in time domain and discrete in voltage domain, i.e. discrete-time discrete-value (digital signal). The function of the main feedback DAC is a zero-order hold, which converts the digital signal to analog signal.

Excess loop delay (ELD) is a known phenomenon in continuous-time sigma-delta ADCs, as described in J. A. Cherry and W. M. Snelgrove, "Excess loop delay in continuous-time Delta-Sigma modulators", IEEE Transactions on Circuits and Systems—II: Analog and Digital Signal Processing, vol. 46, no. 4, pp. 376-389, April 1999. Generally, the loop delay contains the regeneration time of the quantizer, the delay of the feedback DACs and the delay of the circuit between the quantizer and DACs. For high-speed continuous-time Sigma-Delta ADCs, the excess loop delay can be as large as one quantizer sampling clock period (1 $T_s$). The excess loop delay can deteriorate the resolution of the continuous-time sigma-delta ADCs, or even make it unstable. One known technique to compensate the excess loop delay is to add a direct feedback path through an ELD DAC around the quantizer itself, as shown in FIG. 1.

Referring to FIG. 1, a block diagram of part of a first continuous-time sigma-delta ADC 100 with quantization and ELD compensation is illustrated. The first continuous-time sigma-delta ADC 100 includes an input signal 102 and whereby a main feedback signal 103 is subtracted from the input signal 102 in first summing junction 104. The resultant signal is input to a loop filter 106 and a feedback ELD compensation signal 117 subtracted therefrom in a second summing junction 108. The analog signal output from the second summing junction 108 is input to a N-bit quantizer 110, such as an ADC and input to a delay 112, where the N-bit quantizer 110 quantizes the input analog signal into N digital levels where N=2, 3, 4, . . . . The output of the delay 112 is the output 114 of the sigma-delta ADC 100. The output 114 is fed back 116 to an ELD DAC 118, to generate the ELD compensation signal 117 to be input to the second summing junction 108. The ELD compensation is typically implemented by a capacitive DAC and the capacitor of an RC integrator. The feedback 116 is also fed back to a main DAC 120 to generate an analog version of the output signal 114 to be input to first summing junction 104 and thereby form a feedback loop. Notably, an amplifier of the RC integrator is located in the fast feedback loop. However, the amplifiers in the fast feedback loop have very high gain bandwidth (GBW) requirements and they are very power hungry.

FIG. 1 also illustrates a block diagram of part of a second known continuous-time sigma-delta ADC 150 with quantization and ELD compensation. In this second continuous-time sigma-delta ADC 150, the analog signal output from the second summing junction 108 is input to a N-b quantizer 110, such as an ADC and input to a delay 112, where the N-b quantizer 160 quantizes the input analog signal into N digital levels where N=1.

Referring now to FIG. 2, a known example of a conventional SDM system architecture 200 with N-bit quantization and ELD compensation is illustrated. Conventionally, the ELD DAC 118 has a voltage output, and the output of the loop filter 106 is also in the voltage domain. These two voltage signals are summed in summing junction 108, sometimes with a summation amplifier, as described in M. Bolatkale, L. Breems, R. Rutten and K. Makinwa, titled 'A 4 GHz continuous-time $\Delta\Sigma$ ADC with 70 dB DR and −74 dBFS THD in 125 MHz BW', published in IEEE Journal of Solid-State Circuits, vol. 46 no. 12, pp. 2857-2888, December 2011, or with passive components, as described in Y. Dong, W. Yang, R. Schreier, A. Sheikholeslami and S. Korrapati, titled 'A continuous-time 0-3 MASH ADC achieving 88 dB DR With 53 MHz BW in 28 nm CMOS', published in IEEE Journal of Solid-State Circuits, vol. 49, no. 12, pp. 2868-2877, December 2014. The resultant output 209 from the summing junction 108 is the input voltage of the quantizer, which in this figure is shown as a N-bit comparator $Q_{in}$ 210 Here, $Q_{in}$ 209 is compared with several reference voltages $V_{ref1}, V_{ref2}, \ldots, V_{refn}$ 232 in several pre-amplifiers 234. The differences between $Q_{in}$ 209 and $V_{ref1}, V_{ref2}, \ldots, V_{refn}$ 232 are amplified by the gain of the pre-amplifiers 234. These amplified signals are passed to respective latches 236, and are further amplified by the positive feedback of the latches 236. The outputs of the latches are the output of the N-bit comparator 210. These outputs are sampled and passed to the main DAC 120 and ELD DAC 118 via feedback 116.

The loop filter can be in either feed-forward (FF) or feedback (FB) structure. Only one common fast FB path 250 is used for the ELD compensation. In the architecture of FIG. 2, if the total delay of the fast feedback path 250 through the N-bit comparator 210 and ELD DAC 118 is less than a single sampling time period $T_s$ (and the total delay of the slow feedback path through the N-bit comparator 210 and the main DAC 120 is no more than one $T_s$), with proper parameters for the SDM, the SDM can be designed to be stable. In this scenario, a suitable resolution of the SDM can be achieved without use of the ELD loop. However, in a scenario of very high speed continuous-time Sigma-Delta ADCs, the pre-amplifiers 234 have to be optimized for less delay, which limits the gain they can offer, whilst consuming a lot of power. Also, the use of such preamplifiers 234 always creates undesirable delay.

Thus, there is a desire to reduce the effects of, or avoid, the delay introduced by such pre-amplifiers 234 in SDMs, and particularly continuous-time sigma-delta ADCs.

SUMMARY OF THE INVENTION

The present invention provides a SDM with N-b quantization and ELD compensation, an integrated circuit and method therefor as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

FIG. 1 illustrates two block diagrams of known continuous-time sigma-delta ADCs with excess loop delay compensation.

FIG. 2 illustrates a known example of a conventional SDM system architecture with N-bit quantization and ELD compensation.

FIG. 8 illustrates an example circuit schematic of a SDM with N-b quantization and ELD compensation with current mode multi-path ELD compensation, with local time-interleaved latched comparators and comparator error, e.g. comparator offset, calibration circuits, according to some examples of the invention.

DETAILED DESCRIPTION

Figure 3:
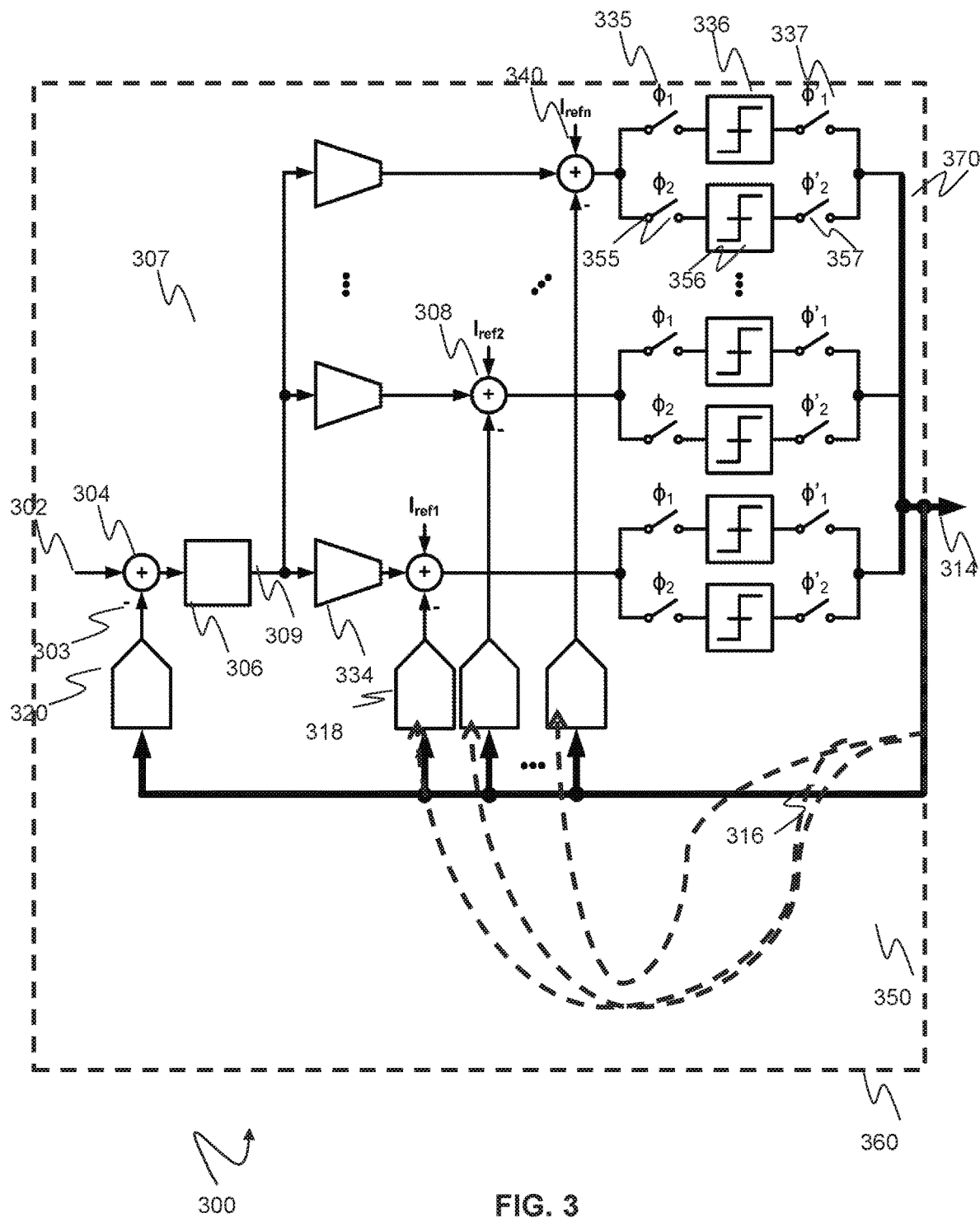
FIG. 3 illustrates an example of a SDM system architecture with N-bit quantization and ELD compensation and local time-interleaved latches, according to some examples of the invention.

Because the illustrated embodiments of the present invention may, for the most part, be implemented using electronic components and circuits known to those skilled in the art, details will not be explained in any greater extent than that considered necessary to understand and appreciate the underlying concepts of the present invention and, in order not to obfuscate or distract from the teachings of the present invention.

In some examples, a current-mode multi-path excess loop delay compensation for continuous-time sigma-delta ADCs with N-bit quantization technique is described that removes the need for pre-amplifiers and therefore reduces the effects of the delay of pre-amplifiers in SDMs, and particularly continuous-time sigma-delta ADCs. The proposed system provides a new ELD compensation approach based on multiple fast feedback loops operating in the current domain and an ADC that includes a plurality of N-bit comparator latches that are each locally time-interleaved with at least a pair of latches configured to function in a complementary manner and provide a combined complementary output.

Examples of the invention describe the plurality of paired latches being configured to provide a complementary output whereby alternate latches of the pair are inactivated or activated in an out-of-synchronisation manner. Examples of the invention describe the complementary arrangement between the paired latches such that a first latch of the pair of latches is configured to be in a regeneration mode concurrently with a second latch being configured to be in a reset and mode and acquire a next initial condition. In some examples, the paired latches form a N-bit 1-bit locally time-Interleaved comparator and the complementary arrangement between the paired latches provides two ADC sampling periods (2 $T_s$) to achieve the next initial condition, regeneration, and reset operations. Although examples of the invention are, in the main, described with reference to a 1-bit locally time-interleaved comparator, it is envisaged that the concepts herein described apply equally to any number of bit (i.e. N-bit) time-interleaved comparator, as would be appreciated by a skilled artisan.

Furthermore, since the N-bit (or in some examples 1-bit) comparator (latch) is locally time-Interleaved, it has 2 $T_s$ to finish three operations (achieve the initial condition, regeneration, reset), instead of 1 $T_s$. Thus, the time to reset and to achieve the initial condition is not within the 1 $T_s$ time budget. Thus, 1 $T_s$ can be completely used for the regeneration phase, and the effective regeneration time of the comparator can be maximized. In addition, the clocking scheme is simpler than the conventional delayed-clocking scheme, which facilitates power efficient clock generation and distribution.

Examples of the invention also describe a duplication of the summation node amongst multiple quantizer paths operating in the current domain. Respective Gm cell and ELD DACs are also duplicated. Instead of comparing the Qin voltage signal with reference voltage signal Vref in the pre-amplifiers, as in the known ELD DAC compensation circuits, a corresponding reference current signal Iref may be added in the same summation nodes. Reference currents are static, pre-selected currents that relate to the voltage reference in the current domain. Thus, the known use of pre-amplifiers, and inherent disadvantages that result therefrom, are removed from the system. The resulting current signal, in examples of the invention, directly drives the paired latches in a form of a comparator latch in a complementary manner.

Examples of the invention provide a N-bit sigma-delta modulator, SDM, that includes an input configured to receive an input analog signal; a first summing junction configured to subtract a feedback analog signal from the input analog signal; a loop filter configured to filter an output signal from the first summing junction: an analog-to-digital converter, ADC, configured to convert the filtered analog output signal to a digital output signal; and a feedback path for routing the digital output signal to the first summing junction. The feedback path includes a plurality of digital-to-analog converters, DACs, configured to convert the digital output signal to an analog form. The ADC includes a plurality of paired latches configured to function in a complementary manner and provide a combined complementary output. An integrated circuit comprising a continuous-time sigma-delta ADC and a method therefor are also described. In this manner, by employing current-mode multi-path excess loop delay compensation of the respective loop filter outputs, respective ELD DAC outputs and a plurality of paired latches configured to function in a complementary manner and provide a combined complementary output, the pre-amplifier is omitted and its delay prevented.

In this manner, by using the proposed local time-interleaving (TI) concept (using TI comparators, the reset time and the time to take the next initial condition is moved out of the typical 1 TS time budget. An extra 1 TS is used to reset and take the next initial condition. The requirement for the reset switch is therefore much relaxed, which allows the size of the reset switch to be reduced, and minimizes the capacitive load on the latch output node. The available effective regeneration time of the comparator latch is determined by TS and the time to sample and pass the latch output to the ELD DAC and main DAC is therefore maximized. Thus, with the same power consumption of the comparator latch, it offers more quantization gain, which reduces the chance of comparator metastability error.

Furthermore, the clock signals are simplified compared with the state-of-the-art approaches, for example where a delayed clocking scheme and several pipelined gain stages to offer the required quantization gain are required, which is very power hungry and complicated for the design.

Although some examples of the invention are described with reference to a multi-bit SDM, it is envisaged that some examples of the invention are equally applicable to a 1-bit SDM. Thus, some examples of the invention are described with reference to a N-bit SDM, where N may be 1 in some implementations. Thus, hereafter, a N-bit SDM encompasses both a 1-bit SDM implementation and a N-bit SDM implementation, where N=1, 2, 3, . . . .

Referring now to FIG. 3, an example of a SDM architecture 300 with N-bit quantization and ELD compensation, according to some examples of the invention, is illustrated. In this example, the SDM architecture 300 includes an input signal 302 whereby a feedback signal 303 is subtracted from the input signal 302 in first summing junction 304. The resultant signal is input to a loop filter 306. The output from the loop filter 306 is input to a series of parallel quantizer paths 307. The number of paths equates to the number of bits of the ADC, with each path equating to the creation of 1-bit.

Each quantizer path 307 includes a transconductance amplifier (Gm) 334 to respectively convert the loop filter's output voltage signal to a current signal. In other examples, any passive or active circuit or component can be used to convert the voltage to current, such as a resistor. Each transconductance amplifier 334 amplifies the filter signal and inputs the amplified signal to a respective second summing junction 308 (on each quantizer path) and a feedback ELD signal subtracted therefrom in respective second summing junctions 308 and a reference current 340 added there to. The analog signals that are output from each of the second summing junctions 308 are input to respective latches 370. The output of each of the latches 370 provides the N-bit output 314 of the sigma-delta ADC 300. The N-bit (illustrated as thick lines) digital signal output 314 is fed back 316 to a set of parallel ELD DACs 318, one per quantizer path 307, in order to generate a respective ELD compensation signals to be input to the respective second summing junctions 308. In this example, the ELD DACs 318 are designed to be current-steering DACs, which have current output. Several reference current signals 340 ($I_{ref1}$, $I_{ref2}$, . . . , $I_{refn}$) are needed and are respectively input to second summing junctions 308. In some examples, dependent upon the transfer function being employed, equally spaced reference currents may be used.

In this manner, the loop filter output signal 309 (once converted to current), output current signals from the ELD DACs 318 and each reference current signal 340 are summed in the current domain with their own corresponding summation node 308. Thus, the summation nodes are duplicated. The resulting current signals directly drive 'n' latches 370. The outputs of the latches 370 are the output of the N-bit comparator. Thus, in the proposed SDM system 300, with (n+1)-level quantization, 'n' Gm cells 334 and 'n' ELD DACs 318 are required, where every ELD DAC 318 is a (n+1)-level DAC. However, and advantageously in this case, the pre-amplifiers employed in known SDM systems with N-bit quantization are no longer needed. Thus, the delay that had been previously introduced by these known pre-amplifiers is no longer a problem.

Generally speaking, the function of the latches 370 has three phases: (i) acquiring the initial condition, (I) regeneration, and (IN) reset. In the conventional system architecture 200 in FIG. 2, the latches have to finish all three phases within one sampling clock period $T_s$. The effective regeneration time is defined as encompassing a time between the comparator latch starting regeneration, and the time the sampler of the latch finishes the sampling. During the effective regeneration time, the comparator latch generates the majority of the required quantization gain for the SDM, for example as the buffers and DAC may also produce some quantization gain. The time to sample and pass the latch output to the ELD DAC and main DAC starts from the moment when the sampler starts to sample the latch output. So the effective regeneration time of the comparator latch, and the time to sample and pass the latch output to the ELD DAC and main DAC have an overlapped time period, which is the time when the latch output sampler is on. In the scenario of very high speed continuous-time Sigma-Delta ADCs, it is preferable to maximize the regeneration time of the latches. Thus, it often requires using very strong reset switches in order to minimize the reset time, which adds load on the output node of the latch.

Thus, in accordance with examples of the invention, local time-interleaved latches 336, 356 are used in the proposed SDM system 300. In this example, for every 1-bit comparator, two latches, e.g. latches 336, 356, form a pair of latches that are configured to be inactivated or activated in a time-interleaved, substantially out-of-synchronisation manner. Thus, each latch from the pair of latches has two phases, namely a first phase of regeneration; and a second phase of reset and taking the next initial condition. In this example, each latch from a pair of latches is operated such that when one latch is in the first phase, the other latch is in second phase. When one latch is in the second phase, input switches 335 are connected, such that the summation result is transferred to the latch as the initial condition. When the latch is in the first phase, for the first more than half time, neither input switches 335 nor output switches 337 are connected, and the latch is re-generating separately from the system. At the end of the first phase, the output switches 337 are connected, and the latch output is sampled. Thus, in this time-interleaved case, the reset time and the time to set the initial condition is moved out from the originally 1 $T_s$ time budget. In examples of the invention, 2*$T_s$ is available for the latch to perform regeneration, reset, and taking the next initial condition. Regeneration takes 1*$T_s$. Reset and taking next initial condition happen at the same time, and they take 1 $T_s$. Hence, the regeneration time of the latches can be maximized, because the regeneration time of one latch is happening whilst the other latch is reset and taking the next initial condition.

In some examples, the SDM and the components or circuits therein, may be implemented in an integrated circuit 380. In other examples, as illustrated in FIG. 4, the SDM and the components or circuits therein may be implemented as a plurality of sliced quantization paths.

Additionally, in the prior art system illustrated in FIG. 2, the summation output (Qin) of summing junction 108 needs to drive multiple pre-amplifiers 234. This implies that a large parasitic capacitance is on the node Qin, which generates a pole and adds delay in the fast feedback loop. In contrast, in the system illustrated in FIG. 3, the loop filter 306 output drives multiple Gm cells 334. The parasitic capacitance on the loop filter 308 output node also generates a pole, but this pole is advantageously located outside of the multiple fast feedback loops 350. Generally, the outer feedback loop is less sensitive to the extra delay than the fast feedback loops 350. For completeness, the feedback 316 is also fed back to a main DAC 320 to generate an analog version of the output signal 314 in first summing junction 304 and thereby form a feedback loop.

Figure 4:
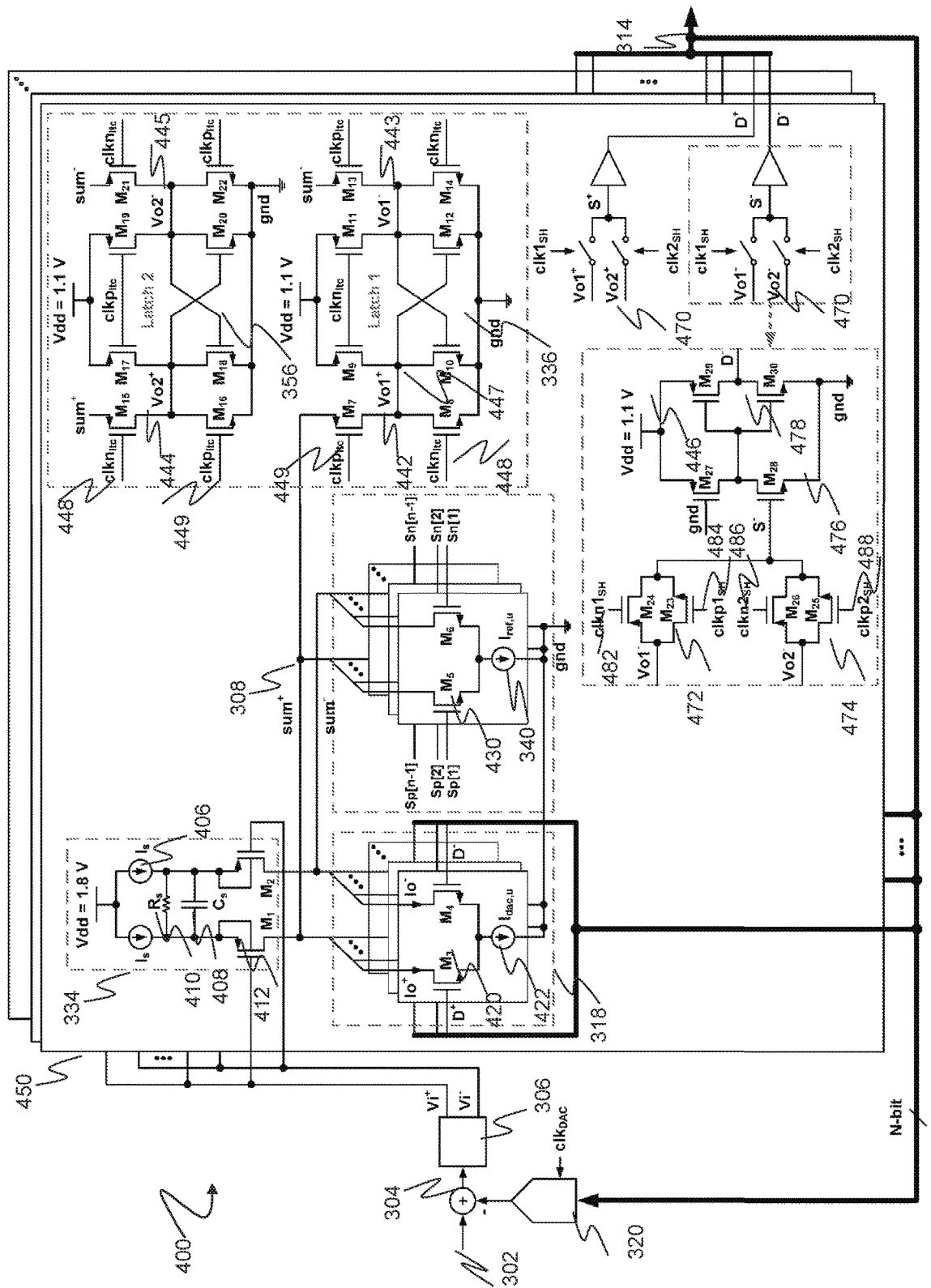
FIG. 4 illustrates an example circuit schematic of a SDM with N-b quantization and ELD compensation and local time-interleaved latches, according to some examples of the invention.

Referring now to FIG. 4, an example transistor-level circuit 400 implementation of the proposed current-mode multi-path ELD compensation in a sliced N-bit SDM, is illustrated according to some examples of the invention. The transistor-level schematics are illustrated with a single-loop SDM architecture, while the proposed ELD compensated N-bit quantizer can be used in various SDM architectures, including Multi-stAge noise SHaping (MASH) SDM architectures. In the example transistor-level implementation 400, a Gm cell, an ELD DAC 318, an associated reference current 340, two time-interleaved (TI) comparator latches 338, 356, a sample and hold (S&H) circuit and buffers compose a slice of the ELD-compensated quantizer. The transistor-level circuit 400 of the proposed SDM system shows the $m^{th}$ slice of the duplicated summation node and 1-bit comparator in detail. Here we assume the SDM uses (n+1)-level quantization. So the SDM has totally n slices of duplicated summation node and 1-bit comparator.

The loop filter 306 has differential voltage outputs $Vi^+$ and $Vi^-$. These differential voltage signals are converted to differential current signals with a source-degenerated transconductance (Gm) stage 334. The Gm cell is implemented as a source degenerated PMOS transconductance amplifier, which is composed of current sources is 406, source-degeneration resistor Rs 410, a capacitor Cs 408 and thin-oxide PMOS transistors M1, M2 412. Source degeneration is employed to improve the linearity of the Gm cell for a large input swing of ±250 mV. Capacitor Cs is added at the source of M1, M2 412 to generate a zero in the transfer function of the Gm stage 334 (V/I converter), and to compensate its phase shift/delay. The current source $I_s$ can be for example implemented as cascaded PMOS current source, as shown.

The bandwidth of the Gm cell affects the stability of the outer FB loop, but not the fast FB loop. The ELD DAC 318 is implemented as a current steering DAC. NMOS switches M3, M4 420 and the current source Idac,u 422 compose a unit ELD DAC 318. NMOS transistors M5, M6 430 and the current source Iref,u construct a reference current unit 340. Both current sources Idac,u and Iref,u are implemented as cascaded NMOS current sources. For (n+1)-level quantization, 'n' reference levels need to be created, and thus (n−1) reference current units are required for every slice. Complementary digital control signals Sp[1]/Sn[1]-Sp[n−1]/Sn[n−1] per slice 450 can be configured to either Vdd (1.1 V) or ground, which define the reference level of the slice. Among different slices 450, the proposed reference current circuits have the same common-mode current, and only their differential current is different. This property ensures that the circuits in different slices 450 are working in the same common-mode condition.

The transistors $M_9$-$M_{12}$ 336 compose one (first) NMOS latch, while the transistors $M_1$-$M_{20}$ 356 compose another (second) NMOS latch. Two complementary clock signals clkpltc 449 and clknltc 448 are needed. In this example, the use of a NMOS latch with PMOS load is designed for maximal quantization gain for the same regeneration time, at the cost of high power consumption.

The transistors M7, M8, M13-M16, M21 and M22 compose the switches between the summation nodes (sum+ and sum−) and the latch output nodes (Vo1+/− and Vo2+/−470) which are also the latch input nodes). They are also used as the reset switches of the latches. As the reset time is 1 TS in the proposed system, which is much longer than the state-of-the-art approaches, the requirement on the reset switches are advantageously much relaxed. During the reset phase, the latch output nodes 470 are reset to a common mode voltage plus a differential voltage as the initial condition of the next regeneration. The common-mode voltage is much lower than the threshold voltage of the NMOS, in order to turn off the positive feedback of the NMOS latch. Thus, no extra tall NMOS or PMOS transistor is required to turn off the latch, which is again different to the state-of-the-art high-speed comparators in ADCs, such as M. Bolatkale, L. J. Breems, R. Rutten, and K. A. A. Makinwa, "A 4 GHz continuous-time ADC with 70 dB DR and −74 dBFS THD, in 125 MHz BW," IEEE J. Solid-State Circuits, vol. 46, no. 12, pp. 2857-2868, 2011.

This has two advantages. First, the number of transistors between the supply is only two in this design, which is one transistor less than the state-of-the-art high-speed comparators, such as the ones described in M. Bolatkale, L. J. Breems, R. Rutten, and K. A. A. Makinwa, "A 4 GHz continuous-time ADC with 70 dB DR and −74 dBFS THD, in 125 MHz BW," IEEE J. Solid-State Circuits, vol. 46, no. 12, pp. 2857-2868, 2011. Thus, the Drain-to-Source voltage VDS is maximized and the transconductance (gm) of the NMOS M10, M12 is also maximized. Secondly, at the beginning of the regeneration, a large peak current is required to charge the internal nodes of the latch, such that the NMOS M10, M12 turn on and the positive feedback starts. The tail NMOS or PMOS transistor limits the maximal peak current through the latch. In order to increase the peak current during the start-up of the regeneration, the tail NMOS or PMOS transistor is usually designed as a large device, which increases the load of the latch clock signal, and increases the power consumption of the clock distribution. After the TI comparator latches 336, 356, two transmission gates M23-M26 472, 474 with two complementary sampling clocks, clkp1SH/clkn1SH, clkp2SH/clkn2SH 482, 484, 486, 488, are employed to sample the TI latches output at the end of the corresponding latch's regeneration phase, and to hold it on their common output capacitance. The transmission gate samplers, M23-M26 472, 474, effectively work as a multiplexer.

In this example, two buffers 476, 478 are inserted between the sampled TI latch output and the input of the ELD DACs 318. The choice of the number of buffers is a trade-off between minimizing the load capacitance of the latch, and reducing the delay of the buffers. The first buffer M27, M28 476 is a NMOS buffer with PMOS load, while the 2nd buffer M29. M30 478 is a CMOS buffer. The NMOS buffer 476 has lower input capacitance than the CMOS buffer 478, but it consumes more power. The CMOS buffer 478 offers rail-to-rail driving ability. For the (n+1)-level quantization, one sampled latch output node should drive 'n' unit ELD DACs after two buffers.

The reference current across all slices is designed to have the same common-mode current for every slice, i.e. $I_{refp,1}$+ $I_{refn,1}$=$I_{refp,2}$+$I_{refn,2}$= ... =$I_{refp,n}$+$I_{refn,n}$. The differential reference current signal $I_{refp,m}$−$I_{refn,m}$ is different for every slice. The source-degenerated Gm stages, the connection circuit, the latches, and the samplers are exactly the same for these 'n' slices.

The $m^{th}$ ELD DAC 318 is an (n+1)-level current steering DAC. The ELD DACs 318 are implemented similarly as the reference current, but their switches are controlled by the digital output of the (n+1)-level comparator. The current sources in the reference current and ELD DACs 318 can be for example implemented as cascaded NMOS current sources. In these examples, the source-degenerated Gm stages, the connection circuit, the latches, and the samplers are exactly the same for each of the 'n' slices.

For the correct operation of the ELD compensation, the (n+1)-level ELD DACs 318 output current should be able to react on the new (n+1)-level comparator output, before the starting point of the next regeneration phase. This means that for one sampled comparator input, its output changes, from the starting time of the regeneration phase, to the time the ELD DAC 318 output current updates, and the total time delay should be less than 1 $T_s$. Otherwise the ELD DAC feedback is too late, and the SDM becomes unstable.

Figure 5:
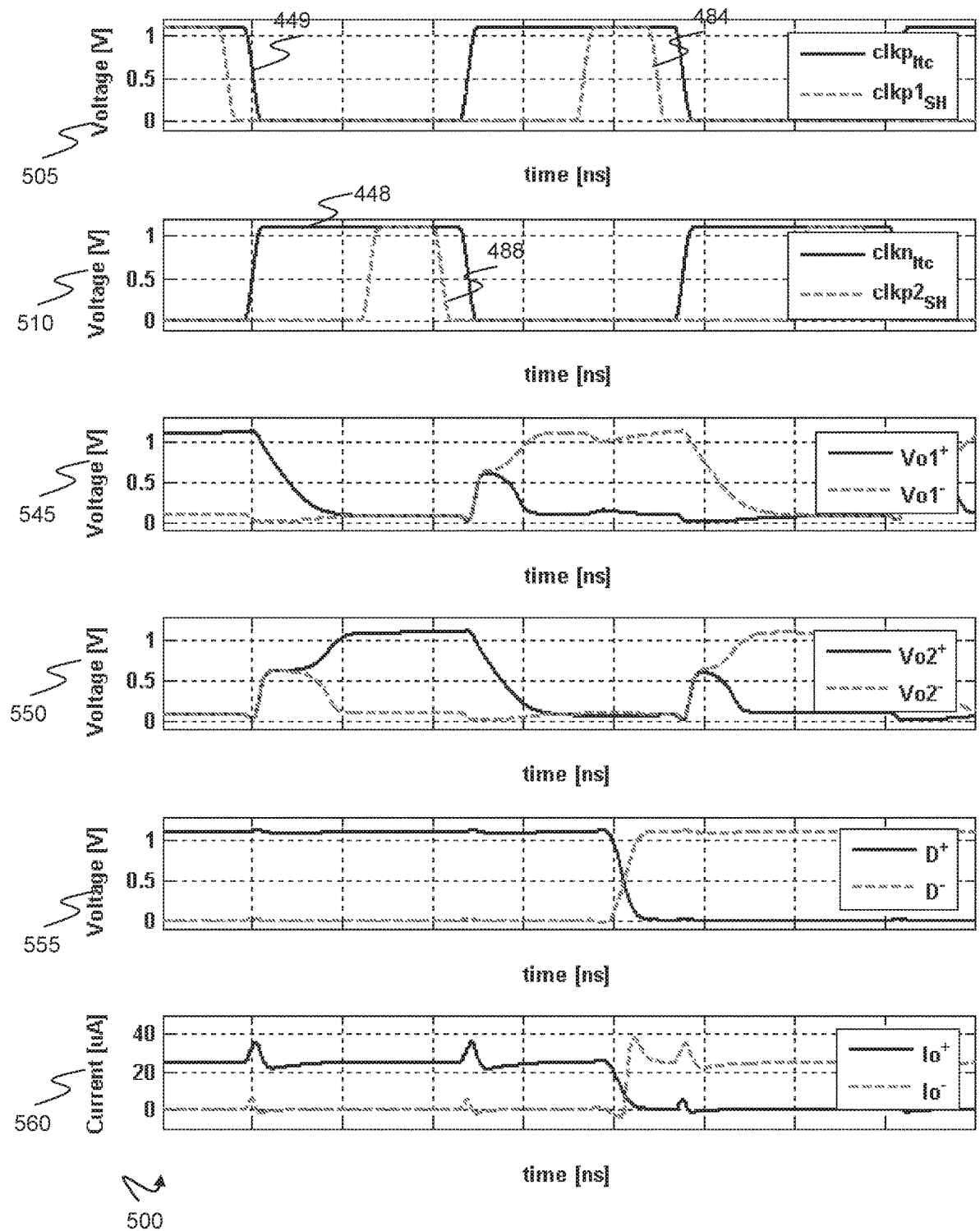
FIG. 5 illustrates an example set of waveforms that clarify one example clock diagram and signal behaviour of the local time-interleaved latches, according to some examples of the invention.

The operation of FIG. 3 and FIG. 4 can also be understood from an example set of waveforms, as illustrated in FIG. 5, which clarify one example of the signal behaviour of some important signals in the proposed SDM system according to some examples of the invention. FIG. 5 shows a first clock waveform 505 that is applied to one of the latch paths, say the latch path that includes switches 335, 337 and latch 336 in FIG. 3. This waveform 505 includes a first latch clock waveform (clkp$_{ltc}$) 449, and a first sampling clock signal (clkp1$_{SH}$) 484. FIG. 5 also shows a second clock waveform 510 that is applied to a second of the latch paths, say the latch path that includes switches 355, 357 and latch 358 in FIG. 3. Here, the second waveform 510 includes a second latch clock waveform (clkn$_{ltc}$) 448, and a second sampling clock signal (clkp2$_{SH}$) 488.

The latch clock signals clkptic 449 and clkn$_{ltc}$ 448 are complementary. They are at the half of the SDM sampling rate, which in this example is 4.2 GHz, and they are with a 50% duty cycle. When clkpltc 449 is high (1.1V) and clknltc 448 is low (0 V), the first latch is in a regeneration phase, and the second latch is resetting and taking the next initial condition. In this phase, the summation result of loop filter output 308, ELD DAC output 318, and reference current 340 is transferred to the second latch as the initial condition of the next regeneration. On the contrary cycle, when clkpltc 449 is low, the second latch is in the regeneration phase, and the first latch is resetting and taking the next initial condition.

The 3rd and 4th waveforms 545, 550 depict the differential output signal of the first latch and the second latch, respectively. At the end of the regeneration phase of the first latch (or second latch), the corresponding sampling clock signal clkp1SH 484 (or clkp2SH 488) becomes high, and the first latch (or second latch, dependent on the point in the cycle) output is sampled. The clkp1SH 484 (or clkp2SH 488) should become low before resetting the first latch (or second latch).

The 5th and 6th waveforms 555, 560 show the input voltage and the output current of a unit ELD DAC 318, respectively. Since the total delay of the fast FB loop should be less than 1 TS (119 psec. In this example), the output current of the ELD DAC 318 must settle before the starting of the next regeneration of either latch. Moreover, the total delay of the current summation and the switches between the summation node and the latch must be very short, such that the ELD feedback information reaches the latch before the start of the next regeneration. In other words, at the starting moment of the next regeneration, which is the sampling moment of the quantizer, the ELD feedback information of the previous sample must already change the latch initial condition, and this change must be settled. In FIG. 5, the output current of the ELD DAC 318 is settled about 15 psec. before the next positive clock edge of clkpltc 449 or clknltc 448, which is a tradeoff between maximizing the effective regeneration time of the latch, and the robustness of the ELD feedback loop.

Thus, when viewed with the circuit of FIG. 4, the operation principle of the proposed schematic is as follows. When clkp is high (and clkn is low), Latch-1 338 (composed of $M_9$-$M_{12}$) is in the regeneration phase, and latch-2 356 (composed of $M_{17}$-$M_{20}$) is in the resetting and tracking initial condition phase. In this case, the function of the N-bit (which in this example is a 1-bit) comparator (latch) is locally time-interleaved. The source-regenerated Gm stage, ELD DAC 318, and reference current 340 are always working. The summation nodes (sum$^+$, sum$^-$) are connected to one of the two latches (in the resetting and tracking initial condition phase). In this example, the summation nodes are relatively stable, except for the transition of the switches (connection circuit).

For latch-1, its connection circuit ($M_7$, $M_8$, $M_{13}$, $M_{14}$) is 'off'. In the beginning of the regeneration phase (when clkp$_{ltc}$ is high and clkp1$_{SH}$ is low), the samplers connected to the outputs of latch-1 are also 'off'. In this period, the voltages of the output nodes of latch-1 (Vo1$^+$, Vo1$^-$) are completely determined by the strong positive feedback of latch-1. So the regeneration of the latch is very fast. In the end of the regeneration phase of latch-1, the clock for the samplers clkp1$_{SH}$ becomes high, and the samplers connected to latch-1 outputs turn on. The latch-1 outputs are sampled and stored property. In examples of the invention, clkp1$_{SH}$ is configured to go low before clkp$_{ltc}$ goes low, to avoid resetting of the sampled latch-1 output signal.

When clkp$_{ltc}$ becomes low (and clkn$_{ltc}$ becomes high), latch-1 starts to reset. In this period, its connection circuit ($M_7$, $M_8$, $M_{13}$, $M_{14}$) is 'on', and the PMOS transistors of latch-1 ($M_9$, $M_{11}$) is off. Both a common-mode current and a differential current go through the connection circuit. The differential current is actually the summation result of the loop filter output differential current signal (the differential drain current signal of $M_1$ and $M_2$), ELD DAC 318 output differential current signal, and reference differential current signal. The common-mode current through the connection circuit is the common-mode current through the source-degenerated Gm stage ($I_s$) 334, minus the common-mode current of the ELD DAC 318 and common-mode reference current. The latch output node is reset to a common-mode voltage level determined by the connection circuit. At the same time, a differential voltage is created on the latch output nodes, which is determined by the differential current signal through the connection circuit. When the next regeneration phase starts (clkp$_{ltc}$ becomes high), the differential voltage signal at the latch output nodes at that time moment creates the initial condition for this new regeneration phase.

From the clock diagram and operation principle in FIG. 4 and FIG. 5, we can see the following advantages of the proposed solution, compared with the conventional circuit architecture (in FIG. 2). Firstly, since the pre-amplifier is no longer part of the system, the delay of the pre-amplifier is saved. Secondly, since the N-bit/i-bit comparator (latch) is locally time-interleaved, it has 2 $T_s$ to finish three operations (i.e. achieve the initial condition, regeneration, reset), instead of 1 $T_s$. Hence, the time to reset and to obtain the initial condition is not in the 1 $T_s$ time budget. Thus, 1 $T_s$ can be completely used for the regeneration phase, and the effective regeneration time of the comparator can be maximized. Thirdly, the clocking scheme is simpler than the conventional delayed-clocking scheme proposed by M. Bolatkale, L. Breems, R. Rutten and K. Makinwa. It shows the potential for more power efficient clock generation and distribution.

The Inventors have identified that, in some instances for some architecture designs, the total input referred comparator offset (visible at the loop filter output node, and thus at the switchable control circuit 602) may be very large. For example with a 3-bit quantization, the input referred comparator offset has a standard deviation of 3 LSB of the quantizer (1σ=3 LSB). Thus, in accordance with some examples of the invention, an offset needs to be calibrated, otherwise the quantizer may not operate in a monotonic manner and the SDM may not be stable. The inventors have further identified that the input referred offset may have several contributors. The most dominant contributor has been found to be the offset of the latch. If the DC gain from the loop filter output to the latch input (Initial condition) is, say, −16 dB, the latch offset is amplified by 16 dB when referred to the quantizer input. The next contributors are the PMOS of the Gm cell 334 ($M_1$, $M_2$), and the switches between the summation nodes and the latches ($M_7$, $M_8$, $M_{13}$, $M_{14}$, $M_{15}$, $M_{16}$, $M_{21}$, $M_{22}$). In some examples, it is envisaged that their offset also need to be calibrated.

Figure 6:
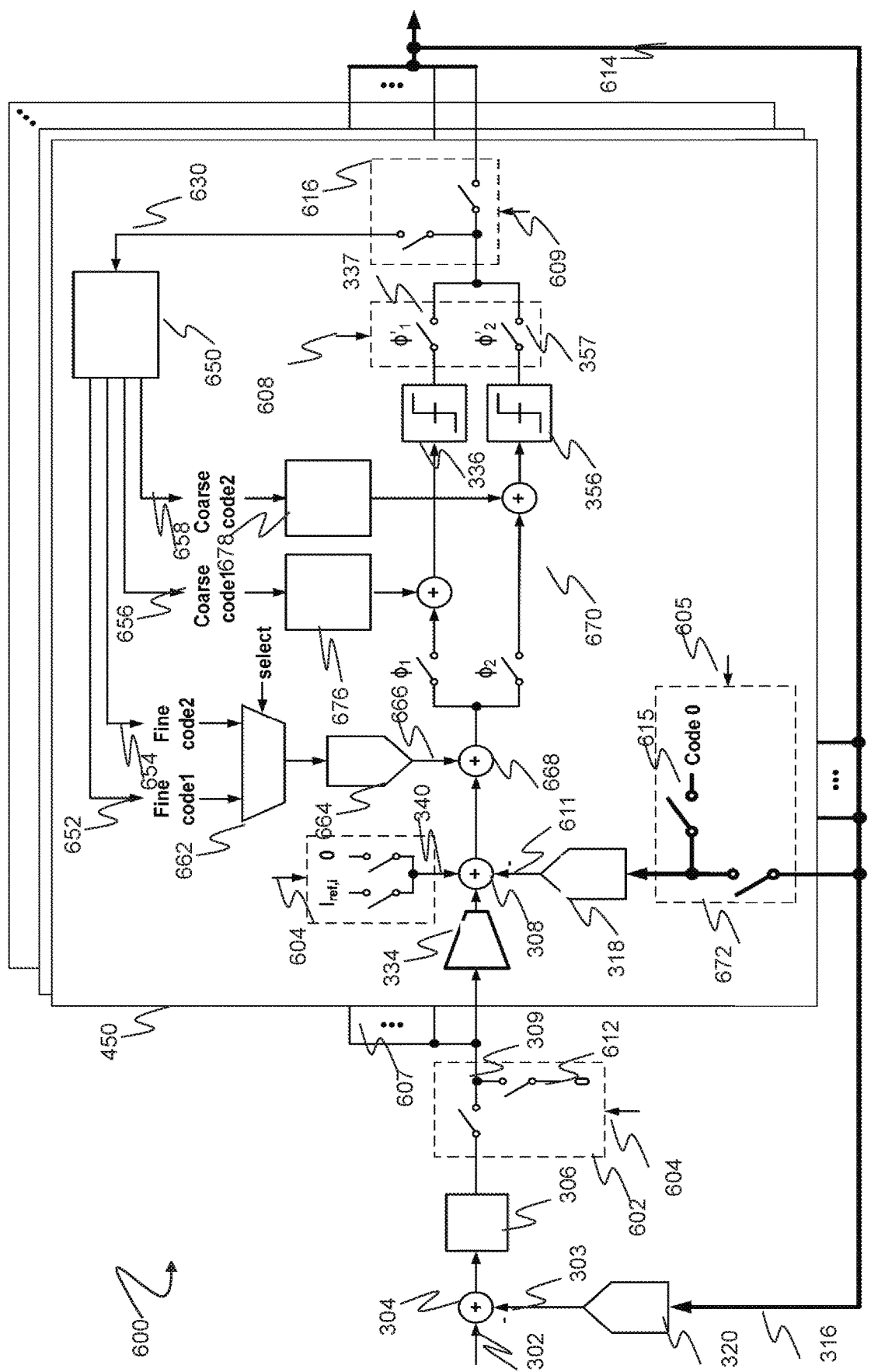

Thus, in accordance with examples of the invention, a SDM system architecture 600 with current mode multi-path ELD compensation, local time-intereaved comparators, and comparator error, e.g. comparator offset, calibration circuits is illustrated in FIG. 6. In this example implementation, a coarse-fine calibration circuit and method are included. The SDM has two modes of operation, a first normal operation mode and a second calibration mode. The mode is defined by the control signal 604.

In this example, the SDM architecture 300 includes an input signal 302 whereby a feedback signal 303 is subtracted from the input signal 302 in first summing junction 304. The resultant signal is input to a loop filter 306. The output from the loop filter 306 is input to a single control circuit 602 having a control input 604 that turns the series of parallel quantizer paths 607 on/off. In this example, each parallel quantizer path 607 is shown as a different IC slice 450. The number of paths equates to the number of thermometer-coded bits of the ADC, with each path equating to the creation of 1-bit.

Each quantizer path 607 includes a transconductance amplifier (Gm) 334 to respectively convert the loop filter's output voltage signal to a current signal. In other examples, any passive or active circuit or component can be used to convert the voltage to current, such as a resistor. Each transconductance amplifier 334 amplifies the filter signal and inputs the amplified signal to a respective second summing junction 308 (on each quantizer path) and a feedback ELD signal 611 subtracted therefrom in respective second summing junctions 308 and a switchable reference current 340 added there to. The analog signals that are output from each of the second summing junctions 308 are input to respective latch circuits 670. The output of each of the latch circuits 670 provides the N-bit output 614 of the sigma-delta ADC 300. The N-bit (illustrated as thick lines) digital signal output 614 is fed back 316 via a control circuit 672 (under control of control signal 605) to a set of parallel ELD DACs 318, one per quantizer path 607. In order to generate a respective ELD compensation signals to be input to the respective second summing Junctions 308. In this example, the ELD DACs 318 are designed to be current-steering DACs, which have current output. Several reference current signals 340 ($I_{ref1}$, $I_{ref2}$, . . . , $I_{refn}$) are needed and are respectively selectively input to second summing junctions 308. In some examples, dependent upon the transfer function being employed, equally spaced reference currents may be used.

In this manner, the loop filter output signal 309 (once converted to current), output current signals from the ELD DACs 318 and each reference current signal 340 are summed in the current domain with their own corresponding summation node 308. Thus, the summation nodes are duplicated. The resulting current signals directly drive 'n' latches 370. The outputs of the latches 370 are the output of the N-bit comparator. Thus, in the proposed SDM system 300, with (n+1)-level quantization, 'n' Gm cells 334 and 'n' ELD DACs 318 are required, where every ELD DAC 318 is a (n+1)-level DAC. However, and advantageously in this case, the pre-amplifiers employed in known SDM systems with N-bit quantization are no longer needed. Thus, the delay that had been previously introduced by these known pre-amplifiers is no longer a problem.

Generally speaking, the function of the latches 370 has three phases: (i) acquiring the initial condition, (ii) regeneration, and (ii) reset. The effective regeneration time is defined as encompassing a time between the comparator latch starting regeneration, and the time the sampler of the latch finishes the sampling. During the effective regeneration time, the comparator latch generates the majority of the required quantization gain for the SDM, for example as the buffers and DAC may also produce some quantization gain. The time to sample and pass the latch output to the ELD DAC and main DAC starts from the moment when the sampler starts to sample the latch output. So the effective regeneration time of the comparator latch, and the time to sample and pass the latch output to the ELD DAC and main DAC have an overlapped time period, which is the time when the latch output sampler is on. In the scenario of very high speed continuous-time Sigma-Delta ADCs, it is preferable to maximize the regeneration time of the latches. Thus, it often requires using very strong reset switches in order to minimize the reset time, which adds load on the output node of the latch.

Again, in the same manner as FIG. 3, local time-interleaved latches 336, 356 are used in the proposed SDM system 300. In this example, for every 1-bit comparator, two latches, e.g. latches 336, 358, form a pair of latches that are configured to be inactivated or activated in a time-interleaved, substantially out-of-synchronisation manner. Thus, each latch from the pair of latches has two phases, namely a first phase of regeneration; and a second phase of reset and taking the next initial condition. In this example, each latch from a pair of latches is operated such that when one latch is in the first phase, the other latch is in second phase. When one latch is in the second phase, input switches 335 are connected, such that the summation result is transferred to the latch as the initial condition. When the latch is in the first phase, for the first more than half time, neither input switches 335 nor output switches 337 are connected, and the latch is re-generating separately from the system. At the end of the first phase, the output switches 337 are connected, and the latch output is sampled. Thus, in this time-interleaved case, the reset time and the time to set the initial condition is moved out from the originally 1 $T_s$ time budget. In examples of the invention, $2*T_s$ is available for the latch to perform regeneration, reset, and taking the next initial condition. Regeneration takes $1*T_s$. Reset and taking next initial condition happen at the same time, and they take 1 $T_s$. Hence, the regeneration time of the latches can be maximized, because the regeneration time of one latch is happening whist the other latch is reset and taking the next initial condition.

In accordance with examples of the invention, the SDM system architecture 600 with current mode multi-path ELD compensation, local time-interleaved comparators, is additionally configured to operate in a calibration mode of operation with a comparator error, e.g. comparator offset, calibration circuit. In the calibration mode of operation, the quantizer input is disconnected at the loop filter output using switchable control circuit 602 and control signal 604. In this instance, the quantizer input may be connected to a fixed voltage (for example a common-mode voltage of the quantizer input signal during normal operation mode) with a differential voltage of '0' 612.

Concurrently, in the calibration mode of operation, the input to the ELD DAC 318 is disconnected from the quantizer output using switchable control circuit 72 and control signal 605, and connected to a fixed code '0' (middle code) 615. The differential reference current 340 is also set to a '0' code 615 in the calibration mode, in response to control signal 604. Thus, Ideally in this example, the differential input of the latch is '0'. Although the calibration circuit 650 is configured to operate on a per 1-bit quantizer (e.g. per slice), it is envisaged that in other examples a different number of bit quantizers or a different number of quantizers per slice may be employed. The calibration circuit 50 is a digital circuit performing the calibration algorithm, which in some examples may also include other circuits and operations, such as multiplexer 662, current steering calibration DAC 664, coarse calibration circuits 676, 678, etc.

The principle of the calibration circuity is as follows. First, the latch-1 338 is under calibration, and only its output is connected to the calibration circuit 650 via control signal 608 that selects a particular latch output and a latch output switchable control circuit 616 with control signal 609. In this manner, the input to the calibration circuit 650 is configured to only be the output from the latch-1 338.

In accordance with examples of the invention, a coarse calibration code for latch-1 656 is swept from −full scale to +full scale using a minimum step of a coarse code. For every coarse code, the latch-1 output is recorded by the calibration circuit 650. By design, it is possible to guarantee that for the coarse code −full scale, the latch-1 output is always '−1' for al mismatch cases. During the sweeping of the coarse calibration code for latch-1 656, when the latch-1 output becomes '+1', the correct calibration code is detected, and the sweeping is stopped. The calibration circuit 650 then sets the coarse for latch-1 656 by at least one step back from the detected value, to take into account any hysteresis. After this first round of coarse code sweeping operation, the coarse calibration of latch-1 338 is completed. In some examples, it is envisaged that the sweeping is performed in a calibration algorithm, rather than binary searching, as it is potentially less sensitive to the hysteresis effect of the comparator.

Additionally, the transfer function of the calibration DACs is inherently monotonic, if an unitary weighted calibration DAC is implemented.

After this first round of coarse code sweeping, the coarse calibration of latch-2 356 commences, in the same manner as that of the coarse calibration of latch-1 336. Thus, when the latch-2 356 is under calibration, and only its output is connected to the calibration circuit 650 via control signal 608 that selects a particular latch output and a latch output switchable control circuit 616 with control signal 609. In this manner, the input to the calibration circuit 650 is configured to only be the output from the latch-2 358.

In some examples, as the calibration of latch-1 336 and latch-2 358 are not completely independent, it is envisaged that multiple iterations of latch-1 336 and latch-2 356 for the coarse calibration operation may be employed. In this example, for multiple iterations, the coarse calibration of both latch-1 336 and latch-2 356 is completed when their identified coarse codes are not changed.

After the coarse calibration iterations are completed, the fine calibration commences. First latch-1 338 is under fine calibration, whereby the fine code-1 652 is swept from a −full scale to +full scale with a minimum step, and a change of the output of latch-1 336 is detected. After a change of the output of latch-1 336 is detected, the sweeping stops. The calibration circuit 650 then sets the fine code 652 for latch-1 656 by at least one step back from the detected value, to take into account any hysteresis.

After this first round of fine code sweeping, the fine calibration of latch-2 356 commences, in the same manner as that of the fine calibration of latch-1 336. Thus, when the latch-2 358 is under calibration, and only its output is connected to the calibration circuit 650 via control signal 608 that selects a particular latch output and a latch output switchable control circuit 618 with control signal 609. In this manner, the input to the calibration circuit 650 is configured to only be the output from the latch-2 356.

In some examples, several iterations of fine calibration of latch-1 338 and latch-2 358 are also employed. The fine calibration of both latch-1 336 and latch-2 356 is finished when their identified fine codes are not changed.

Thus, in this manner, control signals are applied to the comparator latches by calibration circuit 650 to operate the pair of comparator latches 336, 358 in a time-interleaved manner, i.e., turning the path with latch 1 336 'on', with the path with latch 2 358 turned 'off', and then switching the operation of both paths. In some examples, the time-interleaved operation includes iteratively applying a first coarse calibration signal (from first coarse calibration circuit 676) to the first latch 336 (whilst a path containing the second latch 2 356 is disabled) followed by applying a second coarse calibration signal to a second latch of the pair of comparator latches 336, 358. This iterative switching operation is repeated in a time-interleaved manner until the coarse calibration is complete. Thereafter, a first fine calibration signal is applied to the first latch 336, with the path with latch 2 356 being turned 'off', followed by a second fine calibration signal applied to the second latch 356 of the pair of comparator latches 338, 356 with the path with latch 1 338 being turned 'off' at this point. This fine calibration operation may also be iteratively performed in a time-interleaved manner until the fine calibration operation is complete. The use of such an iterative approach is beneficial as the calibration operation of latch 1 336 and latch 2 356 are not independent, i.e. the output from a latch 1 336 calibration result may influence the output of a latch 2 356 calibration, and vice versa. Advantageously, the calibration operation is arranged to function in as similar way as possible to the normal operation of the SDM. In this manner, the calibration provides improved accuracy. However, in a calibration mode of operation, it is noted that the latch not under calibration is not sampled (unlike the normal mode of operation of the ADC SDM).

As illustrated in FIG. 6, in some examples the coarse calibration mode of operation is separated for latch-1 336 and latch-2 358. In contrast, the fine calibration mode of operation may be combined for the two time-interleaved latches. In this example, it may be implemented as a current steering calibration DAC 664. In the calibration mode, the two latches (latch-1 336 and latch-2 356) also work in the time-interleaved way, even though only one latch output is sampled and passed to the calibration circuit 650. In some examples, this configuration may be adopted in order to keep the environment of the quantizer in a calibration mode as close as possible to the normal operation mode. Thus, and thereafter in some examples, it is envisaged that in both a calibration mode and a normal operation mode, the calibration DAC input may toggle between two fine codes, implemented with the multiplexer 662. In some examples, a delayed version of the latch clock signal (clkp$_{ltc}$/clkn$_{ltc}$ 448, 449 in FIG. 4) may be used as the select signal for the multiplexer 662.

In some examples, a fun swing of the coarse calibration may be employed in order to cover all possible cases of a comparator error, e.g. comparator offset. In some examples, a full swing of the coarse calibration may be configured to cover all possible cases of a comparator offset, to ensure that the offset error can be calibrated to the required accuracy. In some examples, a full swing of the fine calibration may be configured to be larger than a coarse calibration step. In some examples, the full swing of the fine calibration may be configured to be larger than a coarse calibration step, as the coarse calibration step is much larger than the required calibration accuracy. After the coarse calibration, it may still have a large residue offset error, which is larger than the required calibration accuracy. To be able to obtain the required calibration accuracy, the fine calibration full swing should be configured to be larger than the residue offset error after the coarse calibration. The residue offset error, after the coarse calibration, is less than a coarse calibration step. So, in some examples and prudently, the fine calibration full swing should be designed to be larger than the coarse calibration step. In some examples, a fine calibration step may be configured according to the calibration accuracy requirement of the system. In some examples, the accuracy of the overall calibration may be determined by the accuracy of the fine calibration. After the coarse plus fine calibration operations have been performed, the residue offset error may be less than the fine calibration step. In this instance, the fine calibration step should be designed according to the calibration accuracy requirement of the system.

Although the example illustrated in FIG. 6 shows a calibration circuit 650 located in each slice, it is envisaged that in some examples that the calibration circuit 650 may be located outside of the respective slices 450 and be operably coupled to inputs and outputs of a plurality of slices. In this configuration, therefore, calibration circuit 650 is shared by each of, or a plurality of, the N 1-bit comparators. Thus N 1-bit comparators need only a single calibration circuit 650. This is in contrast to the architecture illustrated in FIG. 6, whereby a number of calibration circuits 650 are employed, with each calibration circuit 650 dedicated to a single 1-bit comparator (i.e. per slice 450). Thus, in this configuration, therefore, N 1-bit comparators require N copies of calibration circuit 650.

Figure 9:
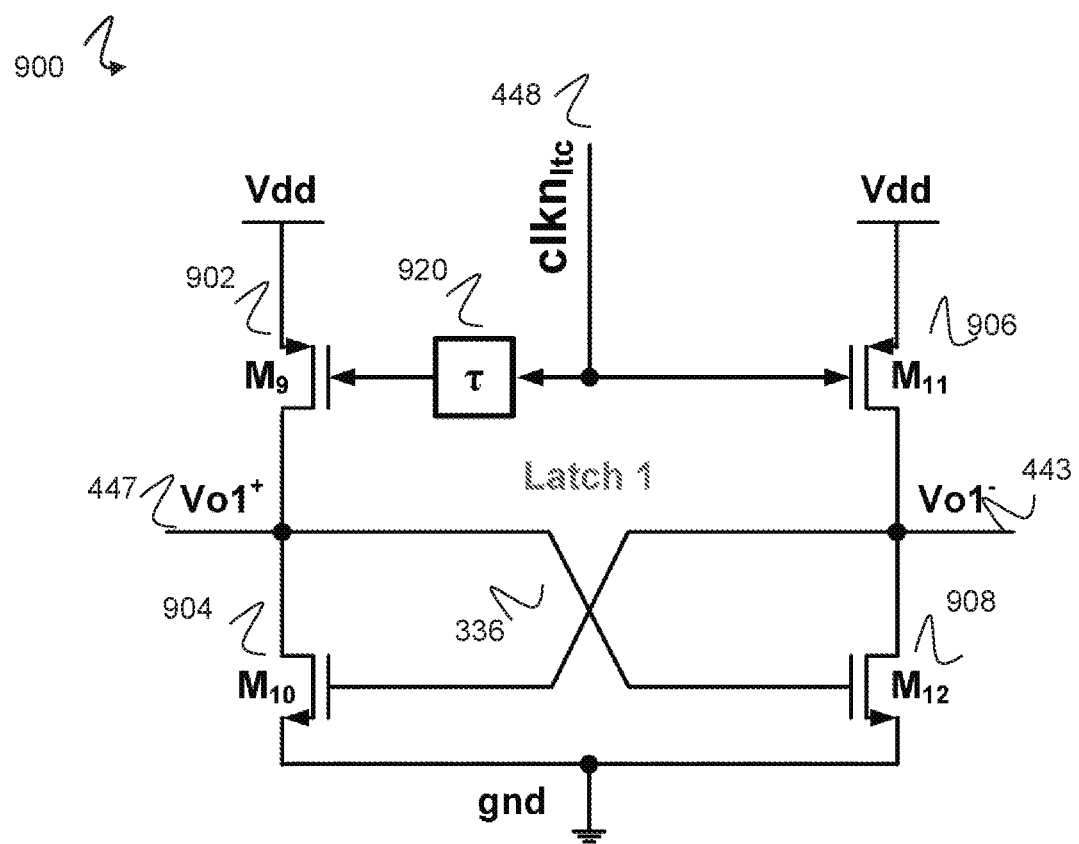
FIG. 9 illustrates one example of a latch of a SDM system architecture with N-bit quantization and ELD compensation with local time-interleaved latches comparators to correct a comparator timing error, according to some examples of the invention.
Figure 10:
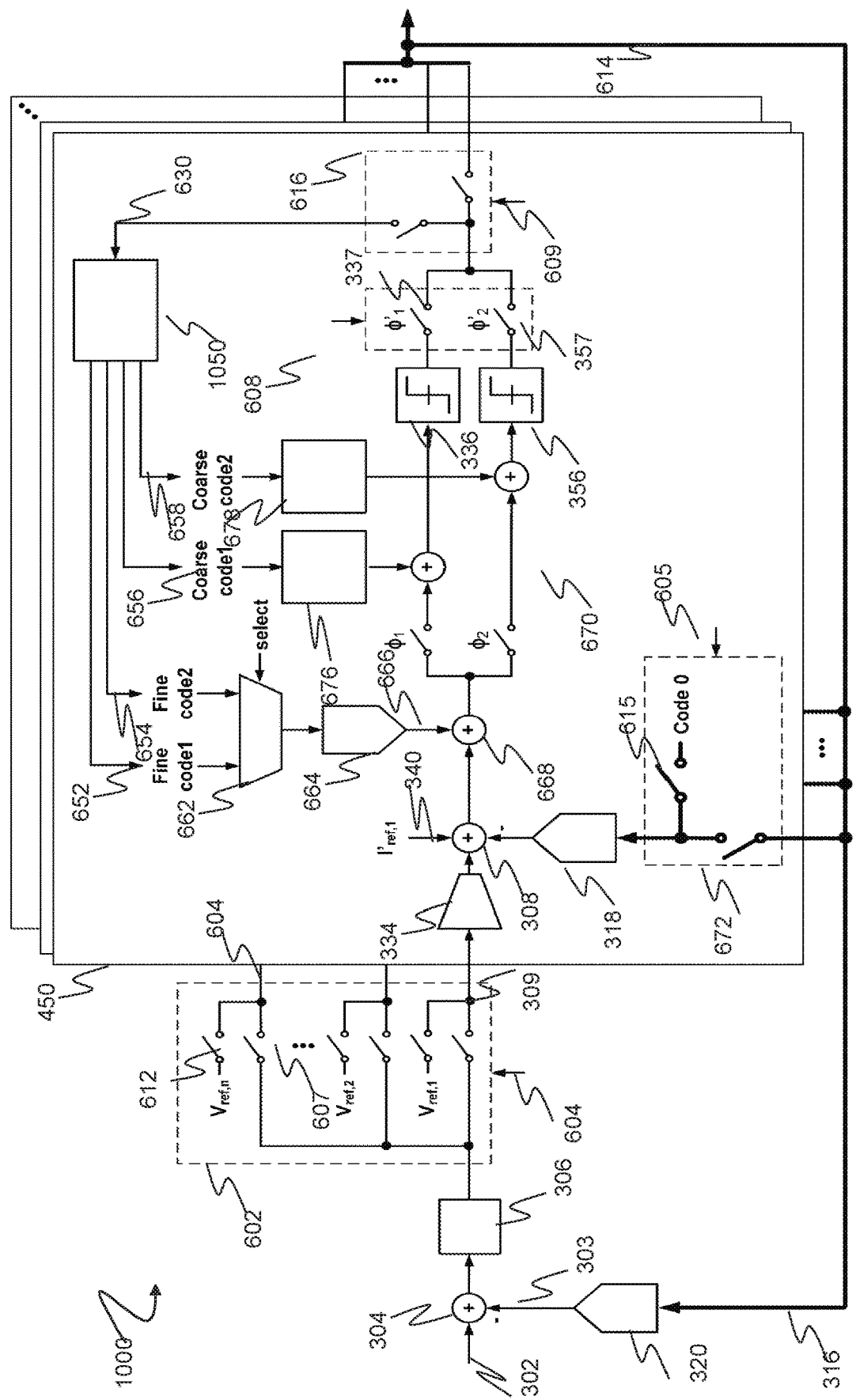
FIG. 10 illustrates one example of a SDM system architecture with comparator reference error and comparator offset calibration, according to some examples of the invention.

Although the illustrated example of the SDM ADC shows a calibration circuit configured to calibrate a comparator error in terms of a comparator offset, it is envisaged that the calibration technique may be used to determine other forms of potential comparator errors, such as a comparator timing error as illustrated in FIG. 9, a comparator reference error as illustrated in FIG. 10, etc.

Although the illustrated example of the SDM ADC shows a calibration circuit configured to operate in two respective stages, i.e. a first coarse calibration stage 676, 678 followed by a second fine calibration stage 664, it is envisaged that in some examples more than two stages may be adopted, e.g. using a very coarse calibration approach, followed by increasingly finer calibrations.

Furthermore, it is envisaged that in some examples a one-stage approach may be adopted. For example, in this example, a first stage that solely uses the coarse calibration circuits 676, 678 may be configured to perform a coarse calibration of the at least a pair of comparator latches 336, 356, whereby the coarse calibration is determined as being sufficient to capture a comparator error of the comparator latches. Again, this coarse calibration operation may be operated in a time-interleaved manner, with the first coarse calibration stage 676 and first latch 336 being turned 'on', whilst the second coarse calibration stage 678 and/or second latch 356 is turned 'off', and then switched to operate in the reverse 'off'-'on' arrangement, with the switching operated iteratively until the coarse codes 656, 658 do not change, as monitored by the calibration circuit 650. In this example, the calibration circuit may determine that the coarse codes 656, 658 are not changing. In a one-step (e.g. coarse calibration only) mode of operation, for some practical examples of the concept herein described, the total calibration range may not need to be so large, or the calibration accuracy requirement may not need to be so high. In these cases, it is envisaged that a one-step calibration may be sufficient, either using only the coarse calibration circuit 676, 678, or using only the fine calibration circuit (calibration DAC 664).

In some examples, the SDM and the components or circuits therein, may be implemented in an integrated circuit. In other examples, the SDM and the components or circuits therein may be implemented as a plurality of sliced quantization paths. In the SDM system illustrated in FIG. 6, the output 309 from the loop filter 306 drives multiple Gm cells 334. The parasitic capacitance on the loop filter 308 output node also generates a pole, but this pole is advantageously located outside of the multiple fast feedback loops 350. Generally, the outer feedback loop is less sensitive to the extra delay than the fast feedback loops 350. For completeness, the feedback 316 is also fed back to a main DAC 320 to generate an analog version of the output signal 314 in first summing junction 304 and thereby form a feedback loop.

Figure 7:
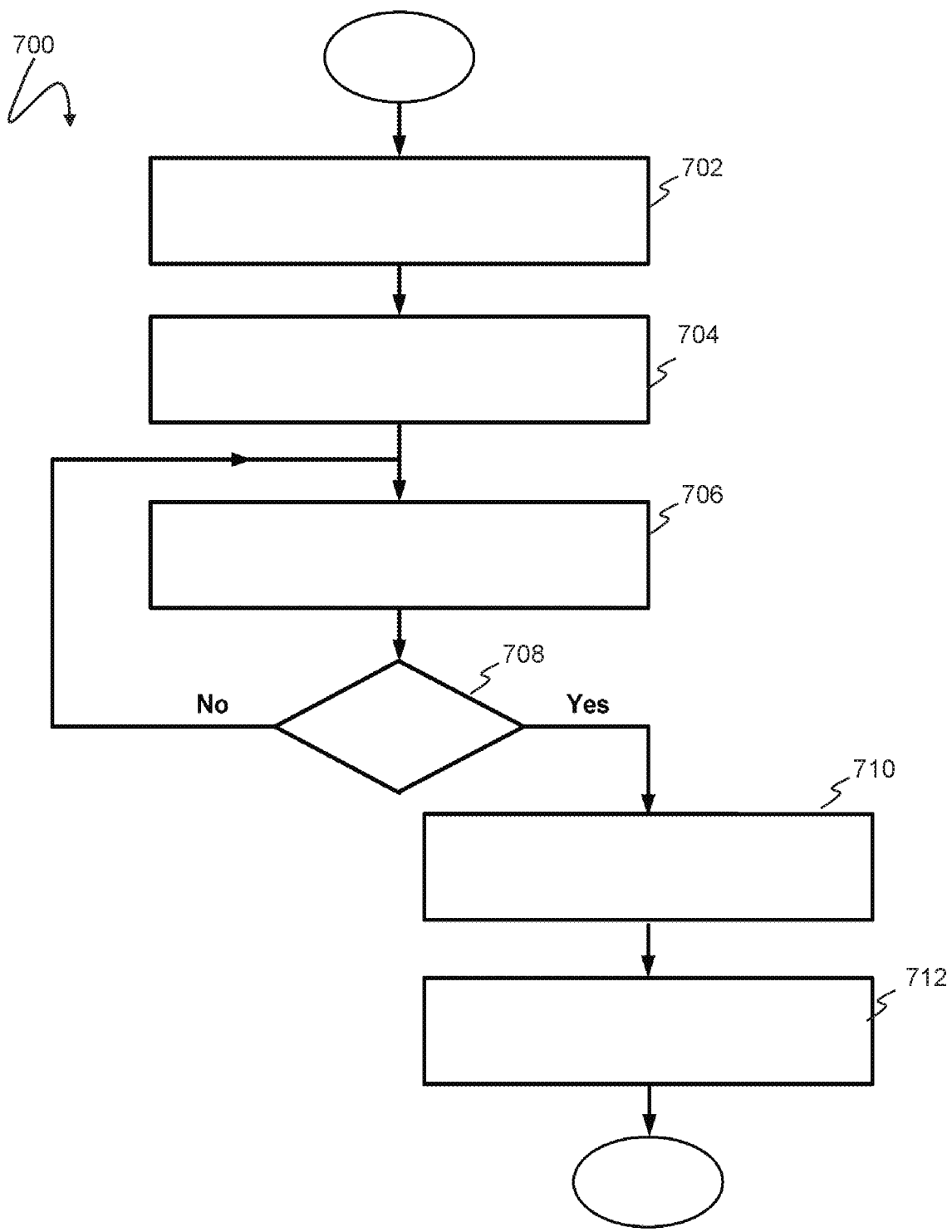
FIG. 7 illustrates an example flow chart of a SDM system with N-bit quantization and ELD compensation with local time-interleaved latches for one round of coarse calibration (latch-1 as an example), according to some examples of the invention.

Referring now to FIG. 7 illustrates an example flowchart 700 of a SDM system with N-bit quantization and ELD compensation with local time-interleaved latches for one round of coarse calibration (latch-1 336 in FIG. 6 as an example), according to some examples of the invention. The flowchart starts with a coarse calibration of latch-1, say, at 702. Here, only the latch-1 output is sampled and passed to a calibration circuit. At 704, the coarse code of latch-1 (coarse code 1) is set to −full scale and the latch output stored. At 708, the first coarse code (coarse code 1) is increased by a minimum step and a determination is made as to whether the latch-1 output has changed at 708. If the latch-1 output has not changed at 708, the flowchart loops in an iterative manner back to 706 until the latch-1 output has changed at 708. At that point, at 710, the first coarse code (coarse code 1) is decreased by a minimum step. At 712, the first round of coarse calibration of latch-1 has completed the flowchart ends.

Figure 8:
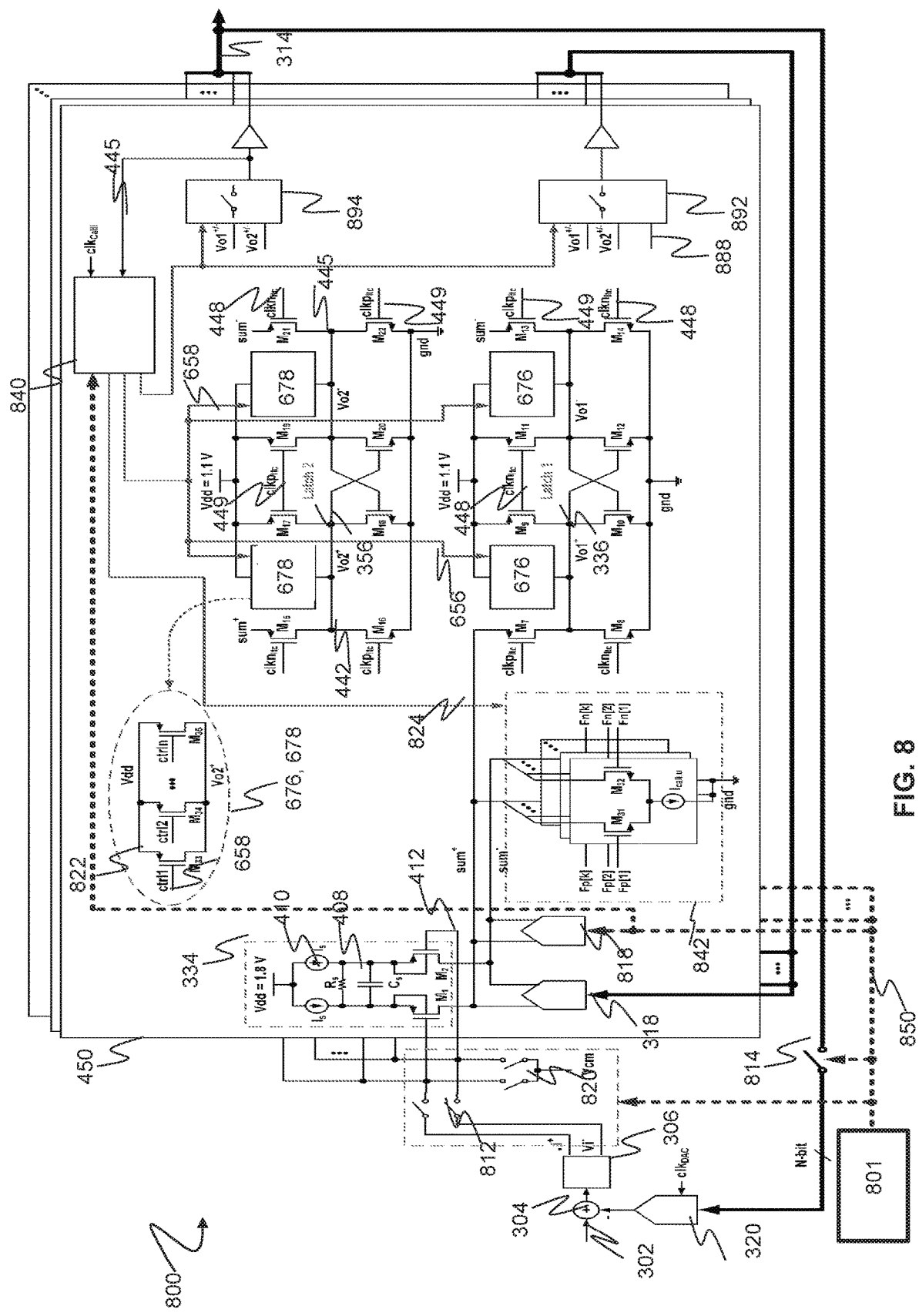
FIG. 8 illustrates an example of a SDM system architecture with N-bit quantization and ELD compensation with local time-interleaved latches comparators and comparator error, e.g. comparator offset, calibration circuits, according to some examples of the invention.

Referring now to FIG. 8, an example transistor-level circuit schematic 800 of a SDM with N-bit quantization and ELD compensation with current mode multi-path ELD compensation, with local time-interleaved latches comparators and comparator offset calibration circuits is illustrated, according to some examples of the invention. In some examples, the local calibration circuit may comprise the coarse calibration circuit 676, 678 and fine calibration circuit 842. In some examples, the coarse calibration circuit 826 may be Implemented as small PMOS devices (sometimes minimum size PMOS devices), in parallel with the PMOS of the latch. The fine calibration circuit 842 may be implemented as a calibration DAC.

The example transistor-level circuit schematic 800 is illustrated with respect to a sliced N-bit SDM, according to some examples of the invention. The transistor-level schematic is illustrated with a single-loop SDM architecture per slice, while the proposed ELD compensated N-bit quantizer can be used in various SDM architectures, including MultistAge noise SHaping (MASH) SDM architectures. In the example transistor-level circuit schematic 800, a Gm cell 334, an ELD DAC 318, a reference DAC 818, a calibration DAC 842, two time-interleaved (TI) comparator latches 336, 358, compose a slice of the ELD-compensated quantizer. The example transistor-level circuit schematic 800 of the proposed SDM system shows the mm slice of the duplicated summation node and 1-bit comparator in detail. Here we assume the SDM uses (n+1)-level quantization. So the SDM has totally n slices of duplicated summation node and 1-bit comparator.

In the same manner as FIG. 4, the loop filter 306 has differential voltage outputs $V_i^+$ and $V_i^-$. These differential voltage signals are converted to differential current signals with a source-degenerated transconductance (Gm cell 334) stage. The Gm cell 334 is implemented as a source degenerated PMOS transconductance amplifier, which is composed of current sources is 406, source-degeneration resistor Rs 410, a capacitor Cs 408 and thin-oxide PMOS transistors M1, M2 412. Source degeneration is employed to improve the linearity of the Gm cell for a large input swing of ±250 mV. Capacitor Cs 408 is added at the source of M1, M2 412 to generate a zero in the transfer function of the Gm cell 334 stage (V/I converter), and to compensate its phase shift/delay. The current source is can be for example implemented as cascaded PMOS current source.

The bandwidth of the Gm cell 334 affects the stability of the outer feedback (FB) loop, but not the fast FB loop. The ELD DAC 318 is implemented as a current steering DAC. The reference DAC 818 is also implemented as a current steering DAC.

The transistors $M_9$-$M_2$ 338 compose one (first) NMOS latch 338, while the transistors $M_{17}$-$M_{20}$ 358 compose another (second) NMOS latch. Two complementary clock signals $clkp_{ltc}$ 449 and $clkn_{ltc}$ 448 are needed. In this example, the use of a NMOS latch with PMOS load is designed for maximal quantization gain for the same regeneration time, at the cost of high power consumption.

The transistors M7, M8, M13-M16, M21 and M22 compose the switches between the summation nodes (sum+ and sum−) and the latch output nodes (Vo1+/− and Vo2+/−470) which are also the latch input nodes). They are also used as the reset switches of the latches. As the reset time is 1 TS in the proposed system, which is much longer than the state-of-the-art approaches, the requirement on the reset switches are advantageously much relaxed. During the reset phase, the latch output nodes 470 are reset to a common mode voltage plus a differential voltage as the initial condition of the next regeneration. The common-mode voltage is much lower than the threshold voltage of the NMOS, in order to turn off the positive feedback of the NMOS latch. Thus, no extra tall NMOS or PMOS transistor is required to turn off the latch, which is again different to the state-of-the-art high-speed comparators in ADCs, such as M. Bolatkale, L. J. Breems, R. Rutten, and K. A. A. Makinwa, "A 4 GHz continuous-time ADC with 70 dB DR and −74 dBFS THD, in 125 MHz BW," IEEE J. Sold-State Circuits, vol. 46, no. 12, pp. 2857-2868, 2011.

This has two advantages. First, the number of transistors between the supply is only two in this design, which is one transistor less than the state-of-the-art high-speed comparators, such as the ones described in M. Bolatkale, L. J. Breems, R. Rutten, and K. A. A. Makinwa, "A 4 GHz continuous-time ADC with 70 dB DR and −74 dBFS THD, in 125 MHz BW," IEEE J. Solid-State Circuits, vol. 48, no. 12, pp. 2857-2868, 2011. Thus, the Drain-to-Source voltage VDS is maximized and the transconductance (gm) of the NMOS M10, M12 is also maximized. Secondly, at the beginning of the regeneration, a large peak current is required to charge the internal nodes of the latch, such that the NMOS M10, M12 turn on and the positive feedback starts. The tail NMOS or PMOS transistor limits the maximal peak current through the latch. In order to increase the peak current during the start-up of the regeneration, the tail NMOS or PMOS transistor is usually designed as a large device, which increases the load of the latch clock signal, and Increases the power consumption of the clock distribution.

The reference current across all slices 450 is designed to have the same common-mode current for every slice, i.e. $I_{refp,1}+I_{refn,1}=I_{refp,2}+I_{refn,2}=\ldots=I_{refp,n}+I_{refn,n}$. The differential reference current signal $I_{refp,m}-I_{refn,m}$ is different for every slice. The source-degenerated Gm stages, the connection circuit, the latches, and the samplers are exactly the same for these 'n' slices.

The $m^{th}$ ELD DAC 318 is an (n+1)-level current steering DAC. The ELD DACs 318 are implemented similarly as the reference current, but their switches are controlled by the digital output of the (n+1)-level comparator. The current sources in the reference current and ELD DACs 318 can be for example Implemented as cascaded NMOS current sources. In these examples, the source-degenerated Gm stages, the connection circuit, the latches, and the samplers are exactly the same for each of the 'n' slices.

For the correct operation of the ELD compensation, the (n+1)-level ELD DACs 318 output current should be able to react on the new (n+1)-level comparator output, before the starting point of the next regeneration phase. This means that for one sampled comparator input, its output changes, from the starting time of the regeneration phase, to the time the ELD DAC 318 output current updates, and the total time delay should be less than 1 $T_s$. Otherwise the ELD DAC feedback is too late, and the SDM becomes unstable.

In accordance with examples of the Invention, the inputs to the latches 336, 356 are connected to a coarse calibration circuit 676, 678, respectively controlled by a series of control signals 656, 658. For example, in some embodiments, when the control signal 656 (ctrl1) is the same as the clock signal of the latch PMOS clkp$_{ltc}$ 449, the small PMOS $M_{33}$ 822 is offering a certain amount of current at the same time of $M_{17}$. Thus, it Implements a coarse step for the offset calibration. When control signal 658 (ctrl1) is VDD (1.1 V), the PMOS $M_3$ 822 is always switched 'off'. In examples of the Invention, the elements of coarse calibration circuit 676, 678 can be either unitary weighted or binary weighted, or a combination of both (for example segmented into a unitary part and a binary part).

In accordance with some examples of the Invention, the fine calibration circuit may be implemented as a current steering DAC (referred to as a calibration DAC 842), similar to the ELD DAC 318 and receiving a fine calibration control signal 824. The unit DAC elements can be either unary weighted or binary weighted, or a combination of both (segmented into an unitary part and a binary part).

In examples of the Invention, the calibration mode and normal operation mode may be controlled by the master controller of the SDM (such as master controller 801 in FIG. 8). The control signals 850 from the master controller 801 are shown as dashed lines. In the context of example embodiments of the invention, the master controller 801 of the SDM may perform three functions. First, master controller 801 controls the switches 812, 820 located between the loop filter and the quantizer, and control the switches 814 located between the sampled quantizer output and the main DACs 320. Secondly, master controller 801 may be configured to control the Input digital code of the reference DACs 818. For example, for a 3-bit quantizer, the input codes of the reference DACs 818 may be each configured to be a '0' (middle code) during a calibration mode of operation. For example, these codes are −3, −2, −1, 0, 1, 2, 3, respectively during a normal operation mode. Thirdly, master controller 801 may be configured to control the calibration mode process. For example, master controller 801 may be configured to define, say, four calibration modes coarse calibration latch-1 336 coarse calibration latch-2 356, fine calibration latch-1 336 and fine calibration latch-2 356, via control of two control signals.

In a calibration mode of operation, the local calibration circuit 840 in one slice (1-bit quantizer) may be configured to generate and store some control signals. In some examples, local calibration circuit 840 also generates and stores the coarse code 1/2 and fine code 1/2 during both calibration mode and normal operation mode. In some examples, the local calibration circuit 840 contains both digital and analog circuits.

In some examples, the latch output samplers for the fast feedback loop (ELD compensation loop) and main feedback loop may be separated. During calibration mode, the sampling clocks for fast feedback loop sampler 892 are disabled by the local calibration circuit 840. A pre-defined code 888 is passed to the fast feedback loop sampler 892 output. For half of the 1-bit quantizer slices, the fast feedback loop sampler 892 outputs are set to '1', while for the other half they are set to '0'. These sampler outputs are transferred to the ELD DACs 318. Thus, a middle code is generated as the ELD DAC input during the calibration mode. It is noteworthy that if the number of the unit ELD DACs per slice is not an even number, one extra unit ELD DAC is required to generate a zero output differential current from the ELD DAC.

The main feedback loop sampler 894 is similar to the fast feedback loop sampler 892, which is shown as one sampler in FIG. 4 that results in clk1$_{SH}$/clk2$_{SH}$ clock signals. In some examples, one difference between the main feedback loop sampler 894 and the fast feedback loop sampler 892 is that the function of using pre-defined code 888 is not needed.

In the calibration mode, when latch-1 is under calibration (either coarse calibration or fine calibration), only the latch-1 output is sampled and passed to the local calibration circuit 840, while the latch-2 output is not sampled. Similarly, when latch-2 is under calibration (either coarse calibration or fine calibration), only the latch-2 output is sampled and passed to the local calibration circuit 840, while the latch-1 output is not sampled.

Although the example illustrated in FIG. 8 shows a local calibration circuit 840 located in each slice, it is envisaged that in some examples that the local calibration circuit 840 may be located outside of the respective slices 450 and be operably coupled to inputs and outputs of a plurality of slices. In this configuration, therefore, local calibration circuit 840 is shared by each of, or a plurality of, the N 1-bit comparators. Thus N 1-bit comparators need only a single local calibration circuit 840. This is in contrast to the architecture illustrated in FIG. 8, whereby a number of local calibration circuit 840 are employed, with each calibration circuit 840 dedicated to a single 1-bit comparator (i.e. per slice 840). Thus, in this configuration, therefore, N 1-bit comparators require N copies of calibration circuit 840.

Referring now to FIG. 9, illustrates one example of a latch circuit 900 for a SDM system architecture with N-bit quantization and ELD compensation with local time-interleaved latches comparators to correct a comparator timing error, according to some examples of the invention. In this example, it is recognised that any timing error that occurs at a comparator latch can cause an unbalance of the two branches of the comparator latch 900. This effect is illustrated in FIG. 9, for example taking the first comparator latch (latch-1) 336 of FIG. 4 composed of transistors $M_9$-$M_{12}$ 902, 904, 906, 908 as an example. It requires a clock signal $clkn_{ltc}$ 448. In the schematic design, the clock signal $clkn_{ltc}$ 448 should arrive at the gate of the PMOS transistors $M_9$ 902 and $M_1$ 906 at the same time. However, due to the unbalance of the layout, or due to the imperfect fabrication, the clock signal $clkn_{ltc}$ 448 can arrive at the gate of the transistors $M_9$ 902 and $M_{11}$ 906 at a different time, because of unbalanced routing time delay (RC delay). Examples of the invention assume that the clock signal $clkn_{ltc}$ 448 arrives at the gate of $M_9$ 902 with a time period τ 920 (second) delayed compared with $M_{11}$ 906. In this case, in the start up of the regeneration phase of this first comparator latch (latch-1) 338, the branch composed of the transistors $M_1$ 906 and M12 908 starts regeneration T (second) earlier than the branch composed of the transistors $M_9$ 902 and $M_{10}$ 904. In this case, if the initial condition of the comparator latch is '0', or even if Vo1$^+$ is only a little bit higher than Vo1$^-$ as the initial condition, the output of the first comparator latch (latch-1) 336 can be Vo1$^-$ higher than the Vo1$^-$, which is different compared with the Ideal clock case. Simply speaking, in this case, the comparator timing error Introduces an 'effective offset' of the comparator. Thus, in some examples, this comparator timing error can be calibrated with the proposed circuit and methods herein described, in the same way as the comparator offset error.

It is envisaged that examples of the invention may be applied to other comparator errors, for example a comparator reference error. Referring back to FIG. 3, the reference current $I_{ref,1}, I_{ref,2}, \ldots, I_{ref,n}$ are designed to be with equal distance, which means:

$$I_{ref,2}-I_{ref,1}=I_{ref,3}-I_{ref,2}=\ldots=I_{ref,n}-I_{ref,n-1} \quad [1]$$

However, due to any unbalance of the circuit layout, or due perhaps to imperfect fabrication, the actual reference current $I'_{ref,1}, I'_{ref,2}, \ldots, I'_{ref,n}$ may be different to the designed value $I_{ref,1}, I_{ref,2}, \ldots, I_{ref,n}$, for example:

$$I'_{ref,1}=I_{ref,1}+I_{error,1}, I'_{ref,2}=I_{ref,2}+I_{error,2} \ldots I'_{ref,n}=I_{ref,n}+I_{error,n} \quad [2]$$

This error in the comparator reference can Introduce non-linearity of the quantizer. If the comparator reference error is too large (e.g. higher than a LSB of the quantizer), it can cause an obvious degradation on the overall signal to noise ratio (SNR) of the SDM.

Referring now to FIG. 10, one example of a SDM system architecture 1000 with comparator reference error and comparator offset calibration is illustrated, according to some examples of the Invention. The architecture in FIG. 10 is similar to that of FIG. 6, so similar features and operations will not be described to avoid obfuscation of the Invention. In this example, the calibration circuit 1050 is adapted to determine a comparator reference error and comparator offset calibration circuits. In this example, in order to calibrate an error in a reference current $I'_{ref,1}, I'_{ref,2}, \ldots, I'_{ref,n}$, a series of accurate voltage reference $V_{ref,1}, V_{ref,2}, \ldots, V_{ref,n}$ are used. In a comparator reference error calibration mode of operation, the quantizer input may be disconnected from the loop filter output, and connected to its corresponding voltage reference $V_{ref,1}, V_{ref,2}, \ldots, V_{ref,n}$ 607, 612. When the input voltage of the gm cells is $V_{ref,1}, V_{ref,2}, \ldots, V_{ref,n}$, 607, 612 the output current of the gm cells 334 should be the ideal reference current with a negative sign $-I_{ref,1}, -I_{ref,2}, \ldots, -I_{ref,n}$. In the calibration mode, in contrast with FIG. 6, the reference current $I'_{ref,i}$ is not switched to a zero differential current. To be able to calibrate the error of $I'_{ref,i}$ it is still connected to the summation mode 668 during the calibration mode. Thus, the summation result of the reference current with errors $I'_{ref,i}$ (i=1, 2, ..., n) and the output current $-I_{ref,i}$ from the gm cell 334 is actually the error in the reference current $I_{error,i}$. This error current $I_{error,i}$ causes a certain "effective offset" of the comparator, which is calibrated by the proposed calibration circuit 1050 and method in a similar way. After calibration, the error in the reference current $I'_{ref,1}, I'_{ref,2}, \ldots, I'_{ref,n}$ is also calibrated. The accuracy of the reference is the same as the accuracy of the voltage reference $V_{ref,1}, V_{ref,2}, \ldots, V_{ref,n}$ (If calibration circuit has enough accuracy). In some example applications, it is envisaged that an accurate voltage reference $V_{ref,1}, V_{ref,2}, \ldots, V_{ref,n}$ may be easier to be generated than an accurate current reference, for example with a resistive ladder. Moreover, this accurate voltage reference is only needed in the calibration mode, which can be switched off during the normal operation mode of the SDM to save power consumption.

Figure 11:
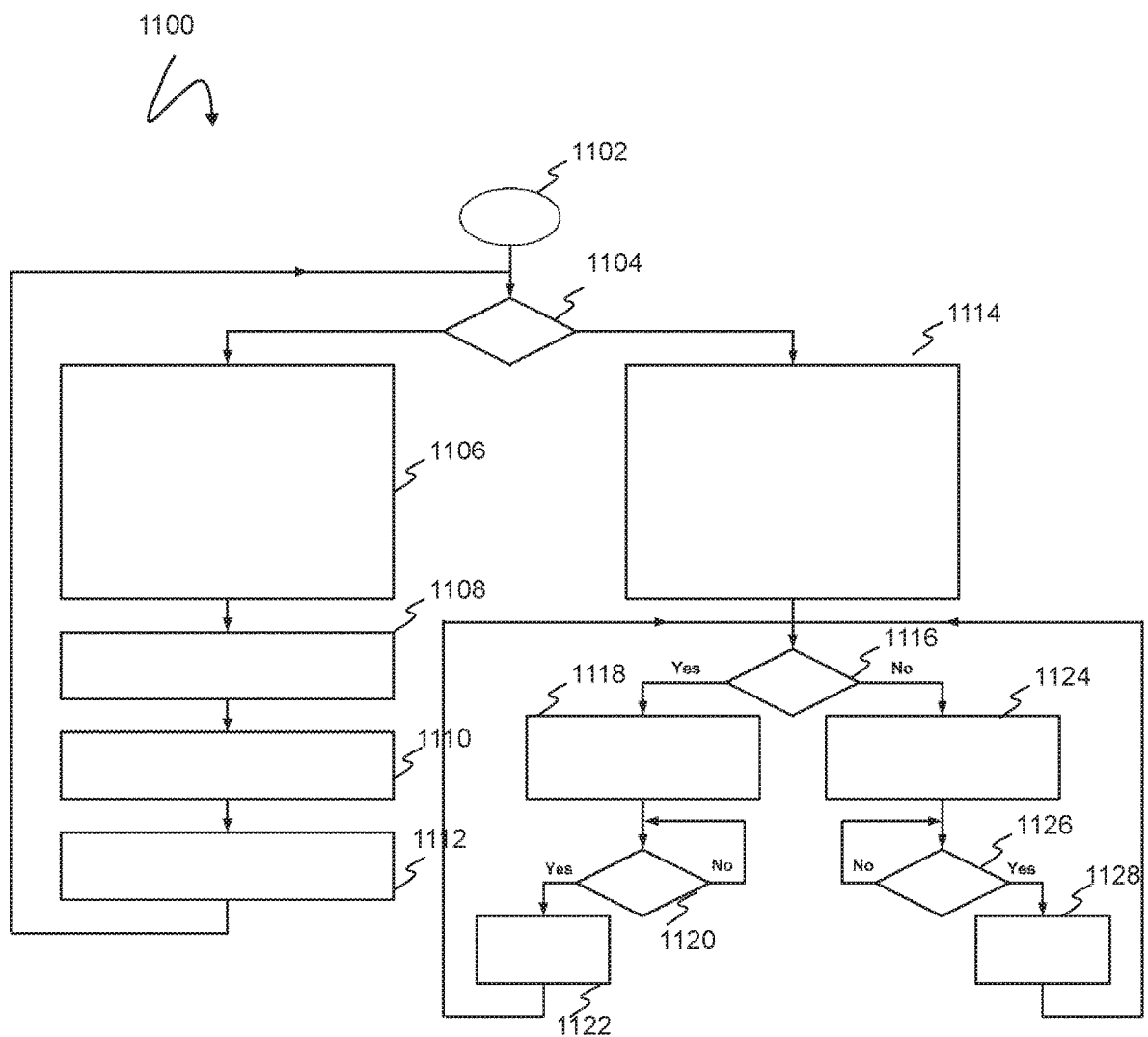
FIG. 11 illustrates an example flow chart of a SDM system with local time-interleaved comparators/latches and comparator error, e.g. comparator offset, calibration, according to some examples of the invention.

Referring now to FIG. 11, an example flowchart 1100 of a SDM system with local time-interleaved comparators/ latches and offset calibration is illustrated according to some examples of the Invention. The flowchart 1100 starts at 1102 and at 1104, a determination is made as to whether the SDM is operating in a calibration mode or a normal operation mode. If the SDM is operating in a calibration mode, at 1106 the quantizer input is disconnected from the loop filter and connected to a common mode voltage Vcm. Additionally, the ELD DAC input is disconnected from the quantizer output and connected to a middle code. The differential current of the reference current is set to '0', in this example and the main DAC Input is disconnected from the quantizer output. At 1108, the coarse calibration process is performed for a number of iterations, until the coarse codes are stable. At 1110, the fine calibration process is performed for a number of iterations, until the fine codes are stable. At 1112, the quantizer offset calibration routine is finished and the process loops to 1104.

If the SDM is operating in a normal operation mode at 1104, then at 1114 the quantizer input is connected to the loop filter output and the ELD DAC input is connected to the quantizer output. A differential current of the reference current is set to the corresponding value for that particular slice, in this example, and the main DAC input is connected to the quantizer output. At 1116, a determination is made as to whether the clock signal of the latch PMOS clkp$_{ltc}$ is high. If the clock signal of the latch PMOS clkp$_{ltc}$ is high at 1116, then at 1118 the first latch (latch-1) is set to a regeneration mode and the second latch (latch-2) is reset and tracks the next initial condition. At 1120, a determination is made as to whether the first sampling clock signal of the latch PMOS clkp1$_{SH}$ is high. If the first sampling clock signal of the latch PMOS clkp1$_{SH}$ is not high at 1120, the flowchart loops to 1120. If the first sampling clock signal of the latch PMOS clkp1$_{SH}$ is high, then at 1122 the first latch (latch-1) is sampled and the flowchart loops to 1116.

If the clock signal of the latch PMOS clkp$_{ltc}$ is not high at 1116, then at 1124 the second latch (latch-2) is set to a regeneration mode and the first latch (latch-1) is reset and tracks the next initial condition. At 1126, a determination is made as to whether the sampling clock signal of the latch-2 clkp2$_{SH}$ is high. If the sampling clock signal of the latch-2 clkp2$_{SH}$ is not high at 1126, the flowchart loops to 1126. If the sampling clock signal of the latch-2 clkp2$_{SH}$ is high, then at 1128 the second latch (latch-2) is sampled and the flowchart loops to 1116.

It is envisaged that in other examples, alternative circuits and components may be employed that utilise the concepts herein before described. For example, it is envisaged that different types of DAC architecture may be employed as the design is not limited to use of current-steering DACs. Furthermore, in other examples, the loop filter may take different forms, e.g. a feedback filter or feedforward filter.

In some examples, a single feedback path may be used. In other examples, as illustrated, multiple paths to multiple separate ELD DACs may be used. In this manner, a use of multiple paths to multiple separate ELD DACs may be employed to optimise the circuit for best timing.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above. The connections as discussed herein may be any type of connection suitable to transfer signals from or to the respective nodes, units or devices, for example via intermediate devices. Accordingly, unless implied or stated otherwise, the connections may for example be direct connections or indirect connections.

The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed. Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality. Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments. Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner. Also for example, the examples, or portions thereof, may implemented as soft or code representations of physical circuitry or of logical representations convertible into physical circuitry, such as in a hardware description language of any appropriate type. The specifications and drawings are, accordingly, to be regarded in an Illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not Indicate that a combination of these measures cannot be used to advantage.

The invention claimed is:

1. A N-bit continuous-time sigma-delta modulator, SDM, comprising:
   an input configured to receive an input analog signal;
   a first summing junction configured to subtract a feedback analog signal from the input analog signal;
   a loop filter configured to filter an output signal from the first summing junction:
   an N-bit analog-to-digital converter, ADC, comprising at least one 1-bit ADC configured to convert the filtered analog output signal to a digital output signal where each 1-bit ADC comprises at least one pair of comparator latches; and
   a feedback path for routing the digital output signal to the first summing junction, wherein the feedback path comprises a plurality of digital-to-analog converters, DACs, configured to convert the digital output signal to an analog form;
   wherein the ADC comprises, or is operably coupled to, a calibration circuit coupled to an input and an output of the at least one pair of comparator latches and configured to apply respective calibration signals to individual comparator latches of the at least one pair of comparator latches in a time-interleaved manner, and calibrate a comparator error of the comparator latches in response to a latched output of the respective calibration signals.

2. The N-bit continuous-time SDM of claim 1 wherein the calibration circuit is configured to operate using at least two-stages, where a first stage performs a coarse calibration of the at least a pair of comparator latches and at least one second stage performs a fine calibration of the at least a pair of comparator latches.

3. The N-bit continuous-time SDM of claim 1 wherein the calibration circuit comprises or is operably coupled to a coarse calibration circuit and the N-bit continuous-time SDM further comprises a master controller configured to apply one or more control signals to select one or more respective comparator latch of the at least a pair of comparator latches for calibrating.

4. The N-bit continuous-time SDM of claim 3 wherein the master controller selects either a coarse calibration or fine calibration mode and selects a respective comparator latch of the at least a pair of comparator latches and sweeps a calibration code of successively modified steps that is input to the selected the respective comparator latch to identify one of a coarse calibration code, a fine calibration code.

5. The N-bit continuous-time SDM of claim 4 wherein the calibration code is swept from a minus full scale to a positive full scale with a minimum step that is input to the selected the respective comparator latch to identify one of a coarse calibration code, a fine calibration code, and in response to a correct calibration code being detected, the calibration circuit selects a code value that is equal to a correct calibration code or at least one less than the correct calibration code for use in a normal mode of operation.

6. The N-bit continuous-time SDM of claim 1 wherein the calibrated comparator error of the comparator latches comprises at least one from a group of: a calibrated comparator offset error, a calibrated comparator timing error, a calibrated comparator reference error.

7. The N-bit continuous-time SDM of claim 1 wherein the calibration circuit is configured to operate in a one-stage manner that is sufficient to capture a comparator error of the comparator latches, whereby the one-stage is either:
   only a coarse calibration circuit configured to perform a coarse calibration of the at least a pair of comparator latches;
   only a fine calibration circuit with a calibration DAC configured to perform a fine calibration of the at least a pair of comparator latches.

8. The N-bit continuous-time SDM of claim 1 wherein the calibration of the comparator error comprises the calibration circuit being configured to apply:
   control signals to the comparator latches to operate the pair of comparator latches in a time-interleaved manner; and
   apply iteratively a first coarse calibration signal to a first latch followed by a second coarse calibration signal to a second latch of the pair of comparator latches, until the coarse calibration is complete;
   apply iteratively a first fine calibration signal to the first latch followed by a second fine calibration signal to the second latch of the pair of comparator latches and repeat until the fine calibration is complete,
   wherein only the output of the latch under calibration is sampled and provided to the calibration circuit.

9. The N-bit continuous-time SDM of claim 1 wherein the calibration of the comparator error comprises a calibration of at least one of the following: a comparator offset, a comparator timing error, a comparator reference error.

10. The N-bit continuous-time SDM of claim 1 wherein the feedback path and the loop filter of the N-bit continuous-time SDM are disconnected from the quantizer to perform a calibration mode of operation and the comparator error calibration performed on the quantizer.

11. The N-bit continuous-time SDM of claim 2 wherein the fine calibration circuit is combined for two time-interleaved comparator latches of the at least a pair of comparator latches.

12. The N-bit continuous-time SDM of claim 11 wherein the fine calibration circuit is implemented as a current steering calibration digital-to-analog converter, DAC.

13. The N-bit continuous-time SDM of claim 12 further comprising a multiplexer wherein an input to the current steering DAC is configured to toggle between two fine codes by the multiplexer.

14. An integrated circuit comprising a N-bit continuous-time sigma-delta modulator, SDM, comprising:
   an input configured to receive an input analog signal;
   a first summing junction configured to subtract a feedback analog signal from the input analog signal;
   a loop filter configured to filter an output signal from the first summing junction:
   an analog-to-digital converter, ADC, configured to convert the filtered analog output signal to a digital output signal and every 1-bit ADC comprising at least one pair of comparator latches; and
   a feedback path for routing the digital output signal to the first summing junction, wherein the feedback path comprises a plurality of digital-to-analog converters, DACs, configured to convert the digital output signal to an analog form;

wherein the ADC comprises, or is operably coupled to, a calibration circuit coupled to an input and an output of the at least one pair of comparator latches and configured to apply respective calibration signals to individual comparator latches of the at least one pair of comparator latches in a time-interleaved manner, and calibrate a comparator error of the comparator latches in response to a latched output of the respective calibration signals.

15. A method for calibrating a N-bit continuous-time sigma-delta modulator, SDM, the method comprising:
receiving an input analog signal;
subtracting a feedback analog signal from the input analog signal in a first summing junction;
filtering an output signal from the first summing junction:
converting the filtered analog output signal to a digital output signal in an N-bit analog-to-digital converter, ADC;
feeding back the digital output signal to the first summing junction, via a digital-to-analog converter, DAC, converting the digital output signal to an analog form;
applying respective calibration signals to individual comparator latches of at least one pair of comparator latches in a time-interleaved manner, and
calibrating a comparator error of the comparator latches in response to a latched output of the respective calibration signals in response to a latched output of the respective calibration signals to calibrate a comparator error of the comparator latches.

16. The method for calibrating a N-bit continuous-time SDM of claim 15, further comprising performing a coarse calibration of the at least a pair of comparator latches in a first operating stage and performing a fine calibration of the at least a pair of comparator latches in a second operating stage.

17. The method for calibrating a N-bit continuous-time SDM of claim 15, further comprising applying one or more control signals to select one or more respective comparator latch of the at least a pair of comparator latches for calibrating.

18. The method for calibrating a N-bit continuous-time SDM of claim 15, further comprising selecting a respective comparator latch of the at least a pair of comparator latches and sweeping a calibration code of successively modified steps that is input to the selected the respective comparator latch to identify one of a coarse calibration code and a fine calibration code.

19. The method for calibrating a N-bit continuous-time SDM of claim 15, wherein the calibrated comparator error of the comparator latches comprises at least one from a group of: a calibrated comparator offset error, a calibrated comparator timing error, and a calibrated comparator reference error.

20. The method for calibrating a N-bit continuous-time SDM of claim 15, further comprising operating in a one-stage manner that is sufficient to capture a comparator error of the comparator latches, whereby the one-stage is either performing a coarse calibration of the at least a pair of comparator latches or performing a fine calibration of the at least a pair of comparator latches.

* * * * *